United States Patent
Huang et al.

(10) Patent No.: US 9,142,954 B2
(45) Date of Patent: Sep. 22, 2015

(54) ESD PROTECTION SYSTEM AND X-RAY FLAT PANEL DETECTOR

(71) Applicant: Shanghai Tianma Micro-Electronics Co., Ltd., Shanghai (CN)

(72) Inventors: Zhongshou Huang, Shanghai (CN); Jun Xia, Shanghai (CN); Wenwen Xiao, Shanghai (CN); Libo Jin, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 233 days.

(21) Appl. No.: 14/018,810

(22) Filed: Sep. 5, 2013

(65) Prior Publication Data

US 2014/0001368 A1   Jan. 2, 2014

Related U.S. Application Data

(63) Continuation of application No. PCT/CN2012/086618, filed on Dec. 14, 2012.

(30) Foreign Application Priority Data

Jun. 29, 2012 (CN) .......................... 2012 1 0225073

(51) Int. Cl.
*G01T 1/17* (2006.01)
*G01T 1/24* (2006.01)
(Continued)

(52) U.S. Cl.
CPC .. *H02H 9/04* (2013.01); *G01T 1/17* (2013.01); *G01T 1/24* (2013.01); *H01L 27/0266* (2013.01); *H01L 27/0296* (2013.01)

(58) Field of Classification Search
CPC .. H02H 9/04; H01L 27/0266; H01L 27/0296; G01T 1/17; G01T 1/24
See application file for complete search history.

(56) References Cited

U.S. PATENT DOCUMENTS

| | | | |
|---|---|---|---|
| 7,532,264 B2 | 5/2009 | Yuan et al. | |
| 2006/0092591 A1* | 5/2006 | Yuan et al. | 361/91.1 |

(Continued)

FOREIGN PATENT DOCUMENTS

| | | |
|---|---|---|
| CN | 101986430 A | 3/2011 |
| CN | 102097059 A | 6/2011 |

(Continued)

OTHER PUBLICATIONS

Notice of Allowance of Korean Patent Application No. 10-2013-7023591, mailed Oct. 24, 2014, 4 pages total.

(Continued)

*Primary Examiner* — Casey Bryant
(74) *Attorney, Agent, or Firm* — Alston & Bird LLP

(57) ABSTRACT

An ESD protection system includes an ESD leakage bus and an ESD protection circuit having one of its terminals connected to the ESD leakage bus. The ESD protection circuit includes at least a pair of amorphous silicon thin film transistors which are connected in a back-to-back manner, and a first shading layer is provided over the channels of the pair of amorphous silicon thin film transistors. When the ESD protection system is applied to an X-ray flat panel detector, no photocurrent will occur during the use of the X-ray flat panel detector, the effect of the photocurrent on the voltage of the scan line is reduced. Further, when the first shading layer is connected to a negative fixed potential, it can be ensured that the ESD protection circuit has small threshold voltage while the leakage current in the ESD protection circuit is reduced, and power consumption is reduced.

26 Claims, 14 Drawing Sheets

(51) Int. Cl.
*H01L 27/02* (2006.01)
*H02H 9/04* (2006.01)

(56) References Cited

U.S. PATENT DOCUMENTS

2006/0279667 A1   12/2006  Tsai et al.
2011/0141550 A1*  6/2011  Ishida .......................... 359/296

FOREIGN PATENT DOCUMENTS

| | | |
|---|---|---|
| CN | 102244082 A | 11/2011 |
| JP | 2011028115 A | 2/2011 |
| JP | 2011123283 A | 6/2011 |
| KR | 20120057421 A | 6/2012 |
| KR | 20120057422 A | 6/2012 |

OTHER PUBLICATIONS

Office Action for Chinese Patent Application No. 201210225073.1, mailed on Mar. 30, 2015, 14 pages total (Partial English translation available).

Office Action for Korean Patent Application No. 10-2013-7023591, mailed Jul. 31, 2014, 12 pages total.

* cited by examiner

ESD PROTECTION SYSTEM AND X-RAY FLAT PANEL DETECTOR

CROSS-REFERENCES TO RELATED APPLICATIONS

This application claims priority to and is a continuation of International Patent Application PCT/CN2012/086618, filed on Dec. 14, 2012 and entitled "ESD PROTECTION SYSTEM AND X-RAY FLAT PANEL DETECTOR", which claims priority to Chinese Patent Application No. 201210225073.1, filed in the People's Republic of China on Jun. 29, 2012 and entitled "ESD PROTECTION SYSTEM AND X-RAY FLAT PANEL DETECTOR", the contents of which are hereby incorporated by reference in their entirety.

BACKGROUND

The invention relates to an ESD protection system, and particularly to an ESD protection system for protecting an X-ray flat panel detector. Further, the invention relates to an X-ray flat panel detector with an ESD protection system.

Presently, there are two types of X-ray flat panel detectors in the market: one is of an indirect energy conversion type, and the other is of a direct energy conversion type. Due to its advantages such as high conversion efficiency, wide dynamic range, high spatial resolution, and enhanced environmental adaptability, the indirect energy conversion type of X-ray flat panel detector has become the most popular detector in the X-ray flat panel detector market.

As shown in FIG. 1, the indirect energy conversion type of X-ray flat panel detector, hereinafter referred to as an X-ray flat panel detector, includes multiple scan lines 2, hereinafter referred to as gate lines, and multiple data lines 3 which are formed on a substrate (not shown). Scan lines 2 and data lines 3 are arranged in an intersecting manner to form multiple pixel regions. A pixel unit 4 is provided in each of pixel regions. A flicker layer or a phosphor layer (not shown) is formed on the substrate and covering the pixel region. Each pixel unit 4 includes a photodiode 5 and a pixel switch 6 having a terminal thereof connected to photodiode 5. The photodiode 5 is adapted to convert visible light into electrical charges. Photodiode 5 is generally formed of amorphous silicon, because amorphous silicon and its alloy, such as amorphous silicon doped with germanium, have high photoelectric conversion function in the wavelength of visible light, has better anti-radiation performance for radiation with high energy, and can be fabricated in large scale. Pixel switch 6 is adapted to control pixel unit 4 to be switched on or off. Pixel switch 6 may be an amorphous silicon thin film transistor or a diode. Pixel switches 6 in each row of pixel units 4 are connected to the same data line 3. Pixel switches 6 in each column of pixel units 4 are connected to the same corresponding scan line 2. The data lines 3 are connected to a data processing unit 7, hereinafter referred to as a readout unit, and scan lines 2 are connected to an address control unit 8, hereinafter referred to as a gate drive unit.

The working principle of the above X-ray flat panel detector is as follows. An X-ray generates the visible light after passing through the flicker layer or the phosphor layer. The visible light is converted into charges by photodiode 5 of pixel unit 4. The charges are stored in photodiode 5. Address control unit 8 applies a line-by-line voltage on scan lines 2 in the pixel array 1, so that pixel switches 6 are switched on line-by-line. The charges stored in photodiode 5 are then output to data processing unit 7 via data lines 3. Data processing unit 7 further performs processes, such as an enlargement and an analogy to digital conversion, on the obtained electrical signal, and thus image information is obtained.

Because the thin films in the photodiode and the TFT (i.e., the pixel switch) in the X-ray flat panel detector are extensive and have large area, electro-static discharge (ESD) is prone to occur during the process of designing, fabricating, assembling and testing of the X-ray flat panel detector. Nearly all of the microelectronic circuits will be very sensitive to the ESD, and thus electro-static protection should be provided for the X-ray flat panel detector, for improving its yield and reducing its production cost.

The ESD protection system of existing X-ray flat panel detectors includes a shorting bus and a metal-insulator-metal diode (MIM diode). However, these ESD protection systems have many problems, such as incompatibility with the testing and maintaining requirements of X-ray flat panel detectors.

To solve the above problems, as shown in FIG. 1, an ESD protection system for providing an ESD protection for an X-ray flat panel detector is disclosed in a US patent publication No. US2006/0092591A1 published on May 4, 2006 and titled "On-Substrate ESD Protection For Array Based Image Sensors". As shown in FIG. 2, the ESD protection system includes an ESD leakage bus 10 formed on a substrate (not shown) and an ESD protection circuit 11 formed on the substrate, where the ESD leakage bus may be grounded. ESD protection circuit 11 has a first wiring terminal 12 connected to ESD leakage bus 10 and a second wiring terminal 13 connected to scan line 2 of the X-ray flat panel detector.

FIG. 3 is a schematic diagram of an equivalent circuit of the ESD protection system depicted in FIG. 2. ESD protection circuit 11 includes a pair of amorphous silicon thin film transistors, i.e., a first amorphous silicon thin film transistor 15 and a second amorphous silicon thin film transistor 16, connected in a back-to-back manner. When ESD occurs on scan line 2 of the X-ray flat panel detector, when the voltage between first wiring terminal 12 and second wiring terminal 13 of the ESD protection circuit is two times larger than the threshold voltage of the thin film transistors, then first amorphous silicon thin film transistor 15 and second amorphous silicon thin film transistor 16 will be switched on, ensuring that the ESD can flow from the scan line 2 into ESD leakage bus 10 in a short time, and thus prevent a part of the detector from being broken-down by the ESD voltage or prevent a generation of a TFT threshold voltage drift or other damages.

FIG. 4 is a sectional view of the first amorphous silicon thin film transistor in the above ESD protection circuit. First amorphous silicon thin film transistor 15 is formed on the substrate 17. Transistor 15 includes a gate 18, an active layer 19 located above gate 18, and a source 20 and a drain 21 are located above active layer 19. Active layer 19 includes an amorphous silicon (a-Si) layer 19$a$ and a N$^+$ amorphous silicon layer 19$b$ located above a-Si layer 19$a$. As shown in FIG. 3, in ESD protection circuit 11, second amorphous silicon thin film transistor 16 has the same structure as that of first amorphous silicon thin film transistor 15.

As shown in FIG. 3 and FIG. 4, it can be seen from the working principles of the X-ray flat panel detector that in the normal use of the X-ray flat panel detector, the X-ray will irradiate the flicker layer or the phosphor layer above the pixel unit, and then be converted into visible light by the flicker layer or the phosphor layer. Because the pixel unit and the ESD protection circuit of the X-ray flat panel detector are formed on the same substrate, the visible light will radiate the ESD protection circuit while radiating the pixel unit. Therefore, first amorphous silicon thin film transistor 15 and second amorphous silicon thin film transistor 16 in the ESD protection circuit will also be exposed to a visible light 22. However, because the channels of first amorphous silicon thin film transistor 15 and second amorphous silicon thin film transistor 16 include amorphous silicon which can convert the visible light into charges, large photocurrent will occur in the ESD protection circuit during the working process of the X-ray flat panel detector.

Since the ESD protection circuit is connected to the scan line of the X-ray flat panel detector, the photocurrent will affect the voltage on the scan line, so that an actual voltage value on the scan line will be deviated from an ideal voltage value. This deviation in scan line voltage will result in the fluctuation of the finally obtained electronic image, e.g. horizontal and vertical stripes will occur in the image, and an increased noise level. In order to make the voltage on the scan line meet the requirements, the voltage on the scan line may be corrected or compensated by an external circuit of the X-ray flat panel detector, which will cause a waste of driving power consumption.

Further, if the pixel switch of the pixel unit is formed by an amorphous silicon thin film transistor, then the amorphous silicon thin film transistor of the ESD protection circuit and the amorphous silicon thin film transistor of the pixel unit may be formed in the same fabricating step, and thus the two thin film transistors have the same threshold voltage. In order to reduce the driving power consumption of the thin film transistor of the pixel unit, and to ensure that the thin film transistor of the ESD protection circuit may be switched on under a relatively low ESD voltage, the thin film transistor of the ESD protection circuit and the thin film transistor of the pixel unit generally have a threshold voltage between 1V and 3V. However, when the X-ray flat panel detector is driven to work normally, the voltage applied on the scan line is normally between −10V and +25V. Because the ESD protection circuit is connected to the scan line of the X-ray flat panel detector, the voltage applied on the thin film transistor of the ESD protection circuit is also between −10V and +25V. Then, a large leakage current will occur in the ESD protection circuit, no matter if the voltage applied on the scan line is a positive voltage or a negative voltage, which will result in a large leakage current on the scan line and cause a great waste of driving power consumption.

Therefore, in the X-ray flat panel detector with the above common ESD protection system, there is a need to maintain a small threshold voltage in the ESD protection circuit while reducing a great waste of driving power consumption in the X-ray flat panel detector.

BRIEF SUMMARY

An ESD protection system, in accordance with one embodiment of the present invention includes, in part, an ESD leakage bus formed on a substrate; and an ESD protection circuit formed on the substrate and having a first wiring terminal and a second wiring terminal. The first wiring terminal is connected to the ESD leakage bus. The ESD protection circuit includes at least a pair of amorphous silicon thin film transistors. The pair of amorphous silicon thin film transistors includes a first amorphous silicon thin film transistor and a second amorphous silicon thin film transistor which are connected in a back-to-back manner, and a first shading layer is provided over the channel of the first amorphous silicon thin film transistor and the channel of the second amorphous silicon thin film transistor.

According to one embodiment, the ESD protection circuit may include a multitude of pairs of amorphous silicon thin film transistors which are connected in series, in parallel, or in series-parallel.

According to one embodiment, an area of the first shading layer may be greater than or equal to that of the channel of the first amorphous silicon thin film transistor and that of the channel of the second amorphous silicon thin film transistor.

According to one embodiment, the ESD leakage bus may be grounded or be connected to a first fixed potential.

According to one embodiment, the first shading layer may be formed of conductive material and may be connected to a second fixed potential.

According to one embodiment, the conductive material may include at least one of Mo, W or Al.

According to one embodiment, the second fixed potential may be a negative fixed potential or a zero potential.

According to one embodiment, the second fixed potential may be provided by an external power supply.

According to one embodiment, the ESD protection circuit may further include a first conductive layer provided above the channel of the first amorphous silicon thin film transistor and the channel of the second amorphous silicon thin film transistor and being contacted with the first shading layer. The first conductive layer is provided above or under the first shading layer and at least overlaps with a part of the first shading layer, the first shading layer is formed of conductive material, and the first conductive layer is connected to a second fixed potential.

According to one embodiment, the conductive material may include at least one of Mo, W or Al.

According to one embodiment, the second fixed potential may be a negative fixed potential or a zero potential.

According to one embodiment, the second fixed potential may be provided by an external power supply.

According to one embodiment, the ESD protection circuit may further include a first conductive layer provided above the channel of the first amorphous silicon thin film transistor and the channel of the second amorphous silicon thin film transistor and being contacted with the first shading layer. The first conductive layer is provided above or under the first shading layer and at least overlaps with a part of the first shading layer, the first shading layer is formed of non-conductive material, and the first conductive layer is connected to a second fixed potential.

According to one embodiment, the second fixed potential may be a negative fixed potential or a zero potential.

According to one embodiment, the second fixed potential may be provided by an external power supply.

An X-ray flat panel detector, in accordance with one embodiment of the present invention includes, in part, a multitude of scan lines and a multitude of data lines formed on a substrate. The multitude of scan lines and the multitude of data lines are arranged in an intersecting manner to form a multitude of pixel regions. A pixel unit including a photosensitive unit and a pixel switch is provided in each of the multitude of pixel regions. The X-ray flat panel detector further includes the ESD protection system described above. The number of the ESD protection circuit in the ESD protection system is one or more, and at least one of the multitude of scan lines is connected to the second wiring terminal of one of the ESD protection circuits.

According to one embodiment, the photosensitive unit may be a photodiode, the pixel switch is an amorphous silicon thin film transistor, the photodiode may include a lower electrode, a photoelectric conversion layer provided on the lower electrode and an upper electrode provided on the photoelectric conversion layer, the lower electrode of the photodiode may be connected to the pixel switch, the upper electrode of the photodiode may be connected to a second conductive layer which is externally biased, and the pixel switch may include the source connected to the lower electrode of the photosensitive unit, the drain connected to one of the data line and the gate connected to one of the scan line.

According to one embodiment, a second shading layer may be provided over the channel of the pixel switch.

According to one embodiment, the second shading layer may at least overlap with a part of the second conductive layer and be contacted with the second conductive layer, and the second shading layer may be provided above or under the second conductive layer.

According to one embodiment, the number of the ESD protection circuit in the ESD protection system may be two or more, the first wiring terminal of one of the ESD protection circuits may be connected to the ESD leakage bus, and the second wiring terminal of the one of the ESD protection circuits may be connected to one of the multitude of scan lines. The first wiring terminal of another of the ESD protection circuits may be connected to the ESD leakage bus, and the second wiring terminal of the another of the ESD protection circuits may be grounded.

An X-ray flat panel detector, in accordance with one embodiment of the present invention includes, in part, a multitude of scan lines and a multitude of data lines formed on a substrate. The multitude of scan lines and the multitude of data lines are arranged in an intersecting manner to form a multitude of pixel regions. A pixel unit including a photosensitive unit and a pixel switch is provided in each of the multitude of pixel regions. The photosensitive unit is a photodiode. The pixel switch is an amorphous silicon thin film transistor. The photodiode includes a lower electrode. A photoelectric conversion layer is provided on the lower electrode and an upper electrode is provided on the photoelectric conversion layer. The lower electrode of the photodiode is connected to the pixel switch, and the upper electrode of the photodiode is connected to a second conductive layer which is externally biased. The pixel switch includes a source connected to the lower electrode of the photosensitive unit, a drain connected to one of the data lines and a gate connected to one of the scan lines. The X-ray flat panel detector further includes the ESD protection system described above. The number of the ESD protection circuit is one or more. At least one of the multitude of scan lines is connected to the second wiring terminal of one of the ESD protection circuits. The second fixed potential is a negative fixed potential, the second conductive layer which is externally biased is connected to the first conductive layer of the ESD protection circuit to provide the second fixed potential, or the ESD leakage bus is connected to the first conductive layer of the ESD protection circuit to provide the second fixed potential.

An X-ray flat panel detector, in accordance with one embodiment of the present invention includes, in part, a multitude of scan lines and a multitude of data lines formed on a substrate. The multitude of scan lines and the multitude of data lines are arranged in an intersecting manner to form a multitude of pixel regions. A pixel unit including a photosensitive unit and a pixel switch is provided in each of the multitude of pixel regions. The photosensitive unit is a photodiode. The pixel switch is an amorphous silicon thin film transistor. The photodiode includes a lower electrode. A photoelectric conversion layer is provided on the lower electrode and an upper electrode is provided on the photoelectric conversion layer. The lower electrode of the photodiode is connected to the pixel switch, and the upper electrode of the photodiode is connected to a second conductive layer which is externally biased. The pixel switch includes a source connected to the lower electrode of the photosensitive unit, a drain connected to one of the data lines and a gate connected to one of the scan lines. The X-ray flat panel detector further includes the ESD protection system described above. The number of the ESD protection circuit is one or more. At least one of the multitude of scan lines is connected to the second wiring terminal of one of the ESD protection circuits. The second fixed potential is a negative fixed potential. The ESD leakage bus is connected to the first shading layer of the ESD protection circuit to provide the second fixed potential.

A better understanding of the nature and advantages of the embodiments of the present invention may be gained with reference to the following detailed description and the accompanying drawings.

DETAILED DESCRIPTION

Figure 1:
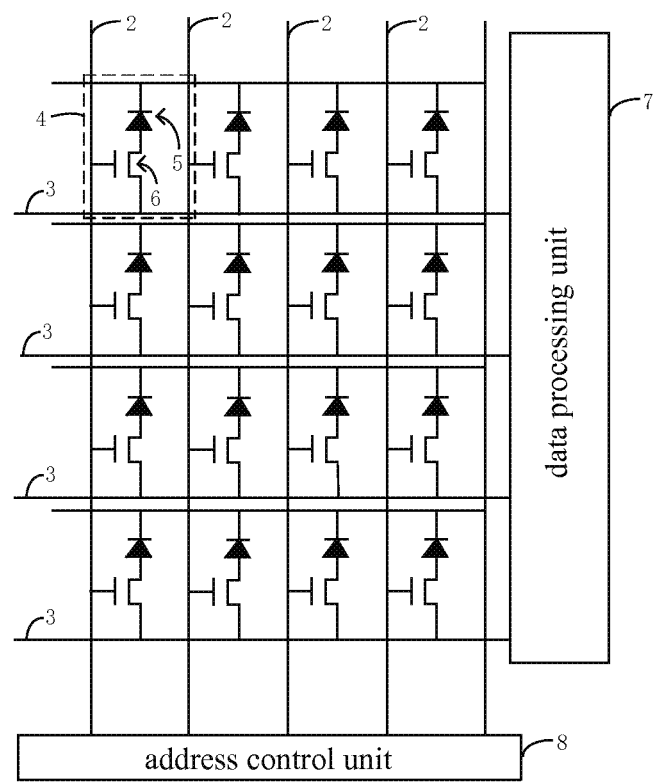
FIG. 1 is a schematic diagram of an equivalent circuit of a pixel array of an existing X-ray flat panel detector.
Figure 2:
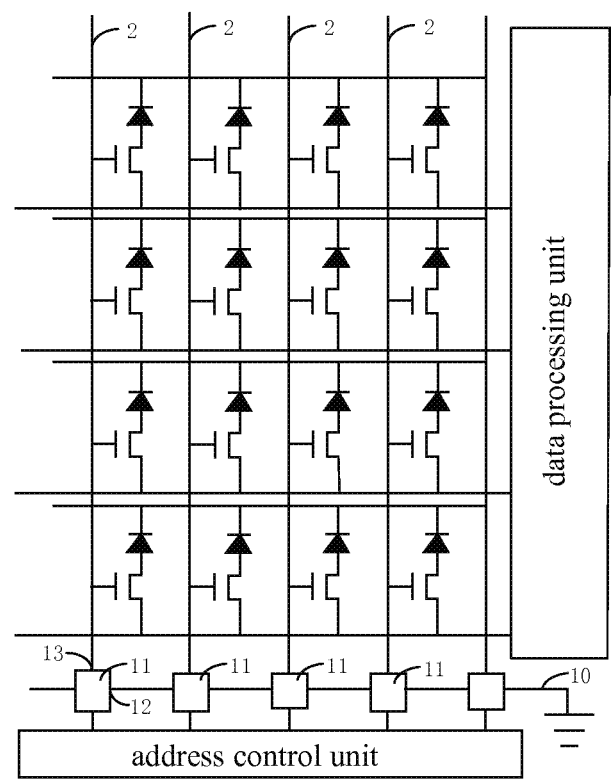
FIG. 2 is a schematic diagram of an equivalent circuit of an X-ray flat panel detector with an ESD protection system, where the ESD protection system includes an ESD leakage bus and an ESD protection circuit, and the ESD protection circuit includes a first amorphous silicon thin film transistor and a second amorphous silicon thin film transistor.
Figure 3:
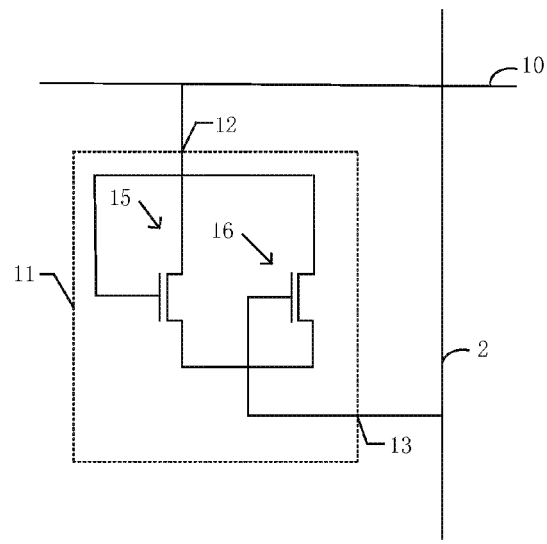
FIG. 3 is a schematic diagram of an equivalent circuit of the ESD protection system in FIG. 2.
Figure 4:
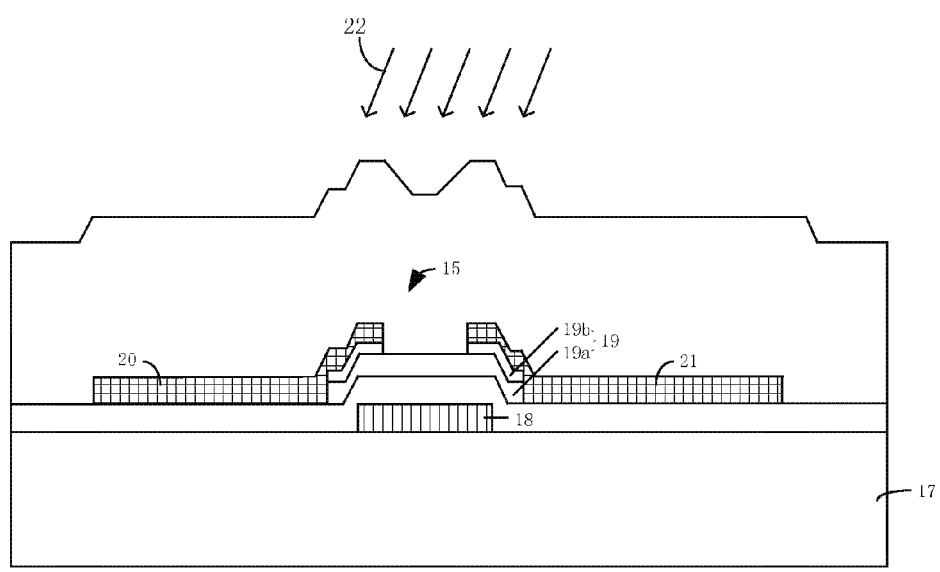
FIG. 4 is a sectional view of the first amorphous silicon thin film transistor of the ESD protection system in FIG. 2.
Figure 5:
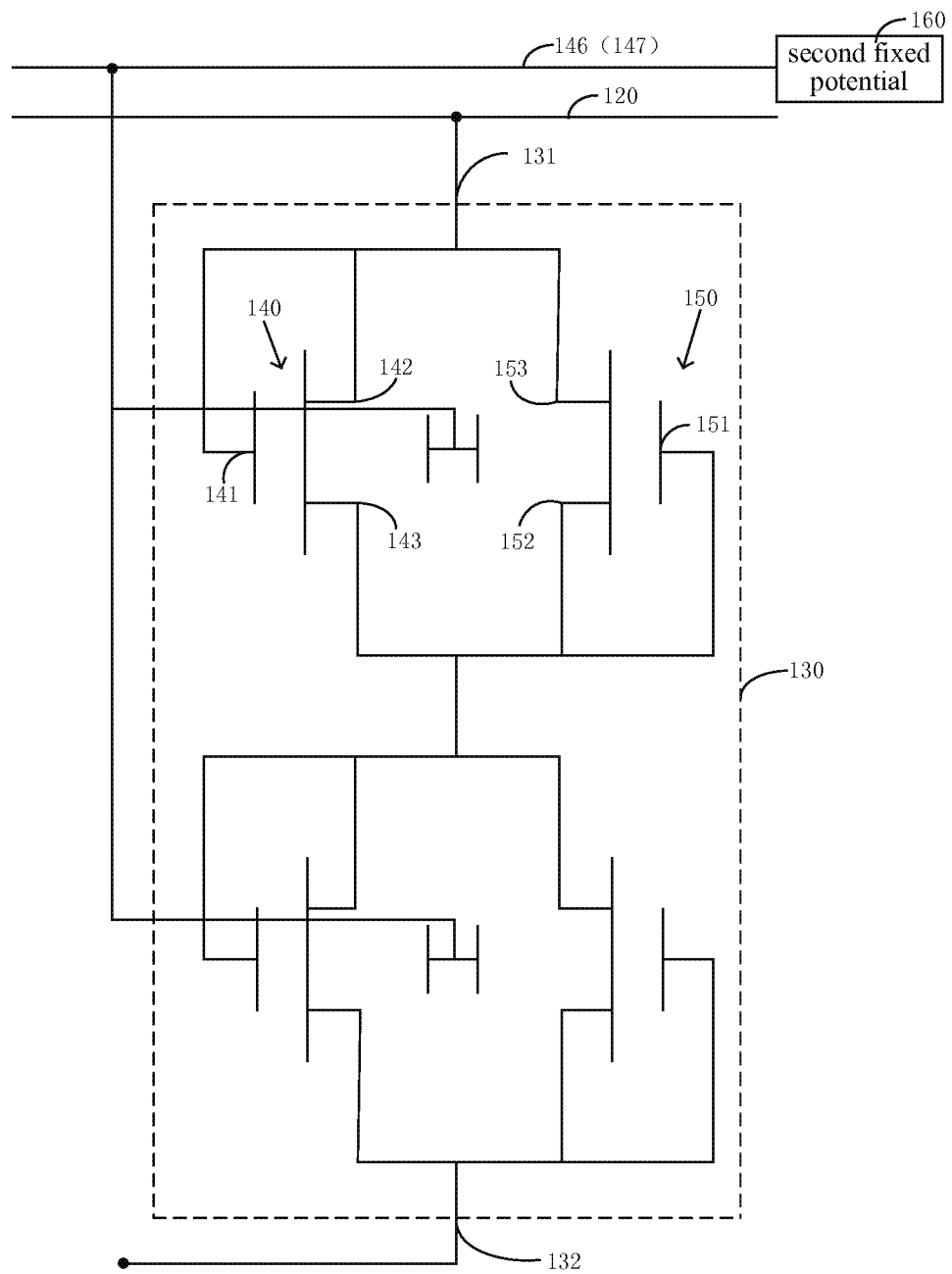
FIG. 5 is a schematic diagram of an equivalent circuit of an ESD protection system in an embodiment of an ESD protection system, in accordance with one embodiment of the present invention.

FIG. 5 is a schematic diagram of an equivalent circuit of an ESD protection system in an embodiment of an ESD protection system, in accordance with one embodiment of the present invention. The ESD protection system includes an ESD leakage bus 120 formed on a substrate (not shown); and an ESD protection circuit 130 formed on the substrate, in which ESD protection circuit 130 has a first wiring terminal 131 connected to ESD leakage bus 120 and a second wiring terminal 132 connected to the circuit for which the ESD protection is to be provided, and the number of ESD protection circuit 130 may be one or more, which may be determined according to the application of the ESD protection system, for providing the optimal ESD protection for the circuit for which the ESD protection is to be provided.

ESD protection circuit 130 includes at least a pair of amorphous silicon thin film transistors (a-Si TFTs). Specifically, the pair of amorphous silicon thin film transistors including a first amorphous silicon thin film transistor 140 and a second amorphous silicon thin film transistor 150 connected in a back-to-back manner. The so-called back-to-back manner is that a gate 141 and a source 142 of first amorphous silicon thin film transistor 140 are connected to a drain 153 of second amorphous silicon thin film transistor 150, and a drain 143 of first amorphous silicon thin film transistor 140 is connected to a gate 151 and a source 152 of second amorphous silicon thin film transistor 150. The connection terminal connected to gate 141 and source 142 of first amorphous silicon thin film transistor 140 and drain 153 of second amorphous silicon thin film transistor 150 serves as a first wiring terminal 131 of the ESD protection circuit 130, and the connection terminal among the drain 143 of the first amorphous silicon thin film transistor 140 and the gate 151 and the source 152 of the second amorphous silicon thin film transistor 150 serves as a second wiring terminal 132 of ESD protection circuit 130. Thus, gate 141 and source 142 of first amorphous silicon thin film transistor 140 and drain 153 of second amorphous silicon thin film transistor 150 are connected to ESD leakage bus 120, and drain 143 of first amorphous silicon thin film transistor 140 and gate 151 and source 152 of second amorphous silicon thin film transistor 150 are connected to the circuit for which the ESD protection is to be provided.

In a preferred embodiment of the invention, the ESD protection circuit 130 includes multiple (two or more) pairs of amorphous silicon thin film transistors, including first amorphous silicon thin film transistor 140 and second amorphous silicon thin film transistor 150, which may be connected in series, in parallel or in series-parallel. If the multiple pairs of amorphous silicon thin film transistors are connected in series, the ESD protection system may endure higher ESD voltage; and if the multiple pairs of amorphous silicon thin film transistors are connected in parallel, the number of the ESD leakage paths of the ESD protection will be increased.

In this embodiment, ESD protection circuit 130 has two pairs of amorphous silicon thin film transistors which are connected in series. When the voltage across first wiring terminal 131 and second wiring terminal 132 of ESD protection circuit 130 is smaller than two times of the threshold voltage of the TFT, only a small amount of current will flow through the TFT due to the high resistance of ESD protection circuit 130. On the contrary, when the voltage across first wiring terminal 131 and second wiring terminal 132 of ESD protection circuit 130 is larger than two times of the threshold voltage of the TFT, then first amorphous silicon thin film transistor 140 and second amorphous silicon thin film transistor will be switched on causing the resistance of ESD protection circuit 130 to be low. In this low resistance case, a large amount of current will flow into ESD leakage bus 120 in a short time, and because ESD leakage bus 120 may be grounded or connected to a first fixed potential, the current may be conducted away.

In order to prevent the visible light from radiating to the channels of first amorphous silicon thin film transistor 140 and second amorphous silicon thin film transistor 150 of ESD protection circuit 130 and result in the generation of photocurrent in ESD protection circuit 130, a first shading layer 146 may be provided over the channels of first amorphous silicon thin film transistor 140 and second amorphous silicon thin film transistor 150. First shading layer 146 is formed of material with low light transmittance, such as metal, inorganic thin film or organic thin film, including opaque ceramic or metal oxide. First shading layer 146 may be formed of conductive material or non-conductive material. In order to ensure that the visible light will not radiate to the channels of first amorphous silicon thin film transistor 140 and second amorphous silicon thin film transistor 150, the area of first shading layer 146 should be greater than or equal to that of the channel of first amorphous silicon thin film transistor 140 and that of the channel of second amorphous silicon thin film transistor 150.

If first shading layer 146 provided over the channels of first amorphous silicon thin film transistor 140 and second amorphous silicon thin film transistor 150 is electrically floating, some uncontrolled effects may be introduced to the ESD protection system and the circuit for which the ESD protection is to be provided, so that the electrical properties of the ESD protection system and the circuit for which the ESD protection is to be provided may be affected. For example, if first shading layer 146 is electrically floating, then the properties of the circuit may be affected, such as the RC delay and the capacitive coupling properties. Further, electrically floating first shading layer 146 may result in an unstable potential of the circuit, which may cause the channel of the amorphous silicon thin film transistor under first shading layer 146 to be difficult to switched on or off normally, so that the ESD protection system may not work normally. Accordingly, first shading layer 146 may be connected to a second fixed potential 160, to prevent the above defects from occurring.

Particularly, the connection of first shading layer 146 to second fixed potential 160 may include connecting first shading layer 146 to second fixed potential 160 directly or connecting first shading layer 146 to another conductive structure, which is connected to second fixed potential 160, if first shading layer 146 is formed of conductive material. Alternatively, the connection of first shading layer 146 to second fixed potential 160 may include connecting first shading layer 146 to another conductive structure, which is connected to second fixed potential 160, if first shading layer 146 is formed of nonconductive material.

Figure 6:
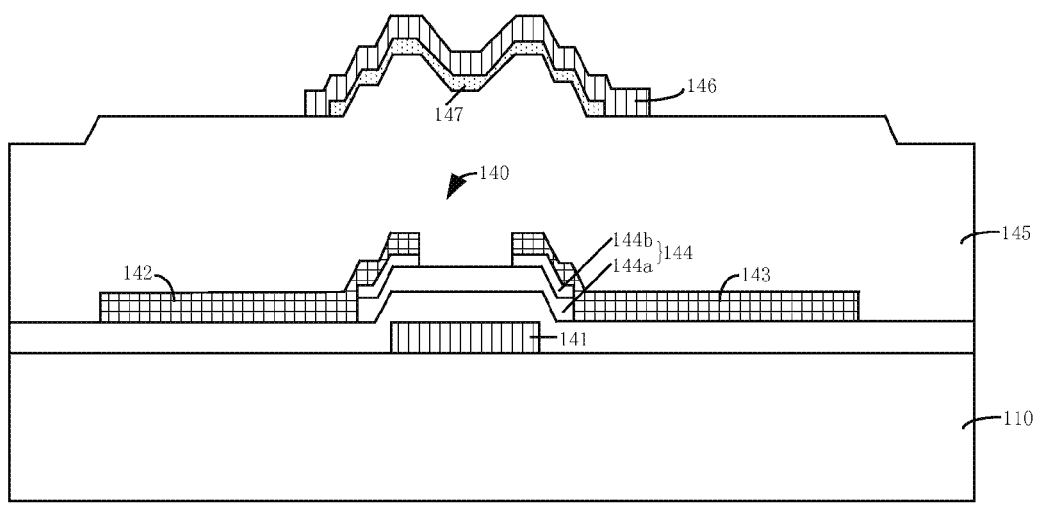
FIG. 6 is a sectional view of a first amorphous silicon thin film transistor in an embodiment of a first amorphous silicon thin film transistor of the ESD protection system in FIG. 5, in accordance with one embodiment of the present invention.

FIG. 6 is a sectional view of a first amorphous silicon thin film transistor in an embodiment of the first amorphous silicon thin film transistor of the ESD protection system in FIG. 5, in accordance with one embodiment of the present invention. As shown in FIG. 6, first amorphous silicon thin film transistor 140 is formed on a substrate 110 and includes gate 141, an active layer 144 provided above gate 141, and source 142 and drain 143 provided above active layer 144. Gate 141 may be formed of metal material, such as Ti, Al or Mo. Active layer 144 includes an a-Si layer 144$a$ and a N$^+$ a-Si layer 144$b$ provided on the a-Si layer 144$a$. Source 142 and drain 143 may be formed of metal material, such as Al or Mo. An insulating layer 145 formed of such material as $SiN_x$ or $SiO_x$, is provided above first amorphous silicon thin film transistor 140. First shading layer 146 is formed above insulating layer 145, and is provided over the channel of first amorphous silicon thin film transistor 140. In order for first shading layer 146 to prevent visible light from radiating to the channel of first amorphous silicon thin film transistor 140, the area of first shading layer 146 should be greater than or equal to that of the channel of first amorphous silicon thin film transistor 140. It should be noted that second amorphous silicon thin film transistor 150 in ESD protection circuit 130 may have the same features as those of first amorphous silicon thin film transistor 140 in FIG. 6, as shown in FIG. 5, which will not be described in detail here.

As shown in FIG. 5 and FIG. 6, in an embodiment, the first shading layer 146 provided over the channel of first amorphous silicon thin film transistor 140 and the channel of second amorphous silicon thin film transistor 150 is formed of conductive material, and first shading layer 146 is connected to second fixed potential 160 directly. In an embodiment, the conductive material includes at least one of Mo, W or Al, and the conductive material may also include other metals. Second fixed potential 160 may be a zero potential, a positive fixed potential or a negative fixed potential. Second fixed potential 160 may be provided by an external power supply, and may also be provided by a corresponding structure with a fixed potential in the circuit for which the ESD protection is to be provided.

As shown in FIG. 5 and FIG. 6, in an embodiment, ESD protection circuit 130 further includes a first conductive layer 147 provided above the channel of first amorphous silicon thin film transistor 140 and the channel of second amorphous silicon thin film transistor 150. First conductive layer 147 may be provided on or under first shading layer 146 (the first conductive layer 147 is shown in FIG. 6 as being provided under first shading layer 146). The first conductive layer 147 may be in direct contact with first shading layer 146. Thus first conductive layer 147 at least overlaps with a part of first shading layer 146. In other words, first conductive layer 147 may be provided over or under first shading layer 146. In addition, first conductive layer 147 may also be provided at the upper right or the bottom right of first shading layer 146 or the upper left or the bottom left of first shading layer 146. First shading layer 146 is formed of conductive material, and first conductive layer 147 is connected to second fixed potential 160. In an embodiment, the conductive material includes at least one of Mo, W or Al, and the conductive material may also include other metals.

Second fixed potential 160 may be a zero potential, a positive fixed potential or a negative fixed potential. Second fixed potential 160 may be provided by an external power supply and may also be provided by a corresponding structure with a fixed potential in the circuit for which the ESD protection is to be provided. In an embodiment, conductive layer 147 may be formed of Indium Tin Oxide (ITO). In another embodiment, first conductive layer 147 may be formed of other suitable conductive materials. It is to be noted that first conductive layer 147 may be formed by using a separate fabricating process, and may also be formed by using the same fabricating process with the corresponding layer in the circuit for which the ESD protection is to be provided. In this way, the fabricating cost of the ESD protection system may be saved, and the fabricating period of the ESD protection system may be reduced.

As shown in FIG. 5 and FIG. 6, in an embodiment, ESD protection circuit 130 further includes a first conductive layer 147 provided above the channel of first amorphous silicon thin film transistor 140 and the channel of second amorphous silicon thin film transistor 150. First conductive layer 147 may be provided on or under first shading layer 146 (the first conductive layer 147 is shown in FIG. 6 as being provided under first shading layer 146). The first conductive layer 147 may be in direct contact with first shading layer 146. Thus, first conductive layer 147 at least overlaps with a part of first shading layer 146. In other words, first conductive layer 147 may be provided over or under first shading layer 146, and first conductive layer 147 may also be provided at the upper right or the bottom right of first shading layer 146 or the upper left or the bottom left of first shading layer 146. The first shading layer 146 may be formed of nonconductive material, and first conductive layer 147 may be connected to second fixed potential 160.

Second fixed potential 160 may be a zero potential, a positive fixed potential or a negative fixed potential. Second fixed potential 160 may be provided by an external power supply and may also be provided by a corresponding structure with a fixed potential in the circuit for which the ESD protection is to be provided. In an embodiment, the conductive layer 147 may be formed of ITO. In another embodiment, first conductive layer 147 may be formed of other suitable conductive materials. It is to be noted that first conductive layer 147 may be formed by using a separate fabricating process, and may also be formed by using the same fabricating process with the corresponding layer in the circuit for which the ESD protection is to be provided. In this way, the fabricating cost of the ESD protection system may be saved, and the fabricating period of the ESD protection system may be reduced.

After first shading layer 146 is provided over the channel of first amorphous silicon thin film transistor 140 and the channel of second amorphous silicon thin film transistor 150, insignificant photocurrent will occur in ESD protection circuit 130 when the ESD protection system is exposed to visible light. The ESD protection system according to the present invention is generally provided at a peripheral region of the circuit for which the ESD protection is to be provided, and the position of the ESD protection system should be decided according to the specific structure of the circuit for which the ESD protection is to be provided, and will not affect the normal work of the circuit for which the ESD protection is to be provided.

Figure 7:
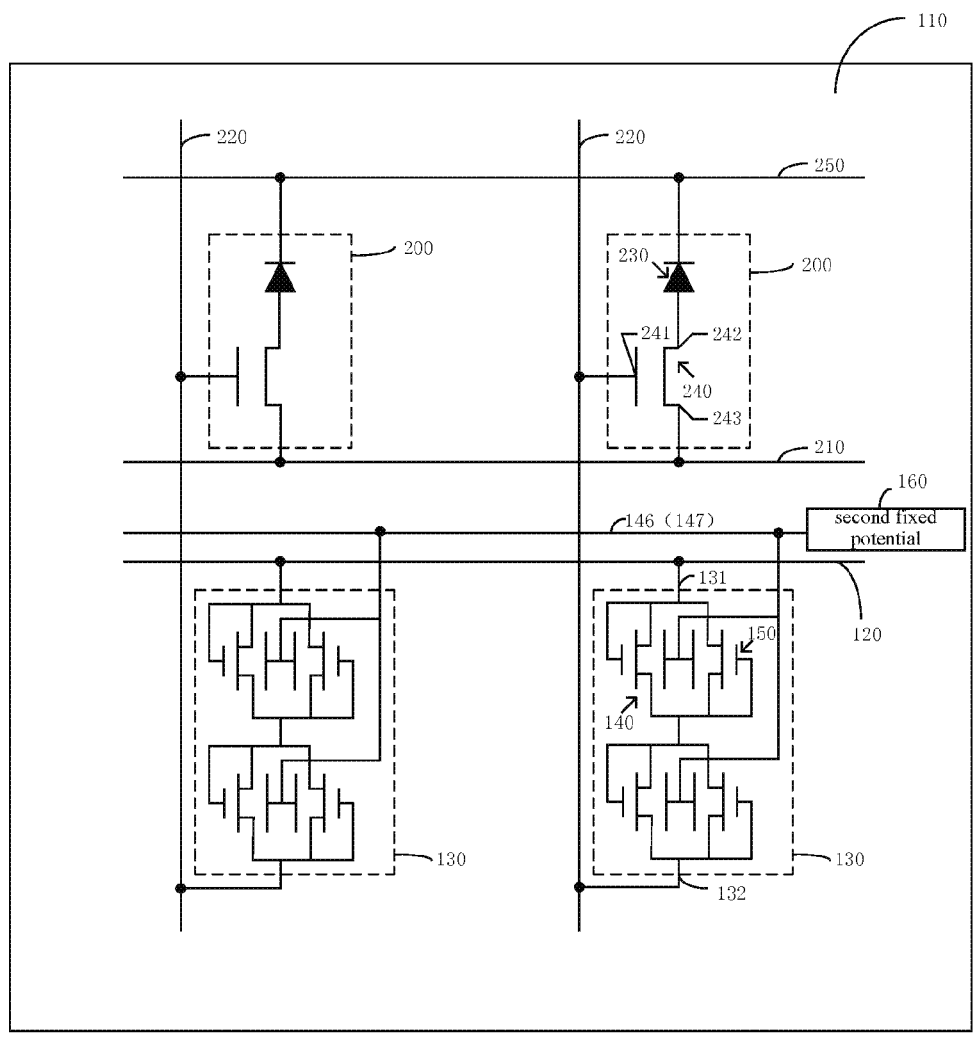
FIG. 7 is a schematic diagram of an equivalent circuit of an X-ray flat panel detector in an embodiment of an X-ray flat panel detector with an ESD protection system, in accordance with one embodiment of the present invention.
Figure 8:
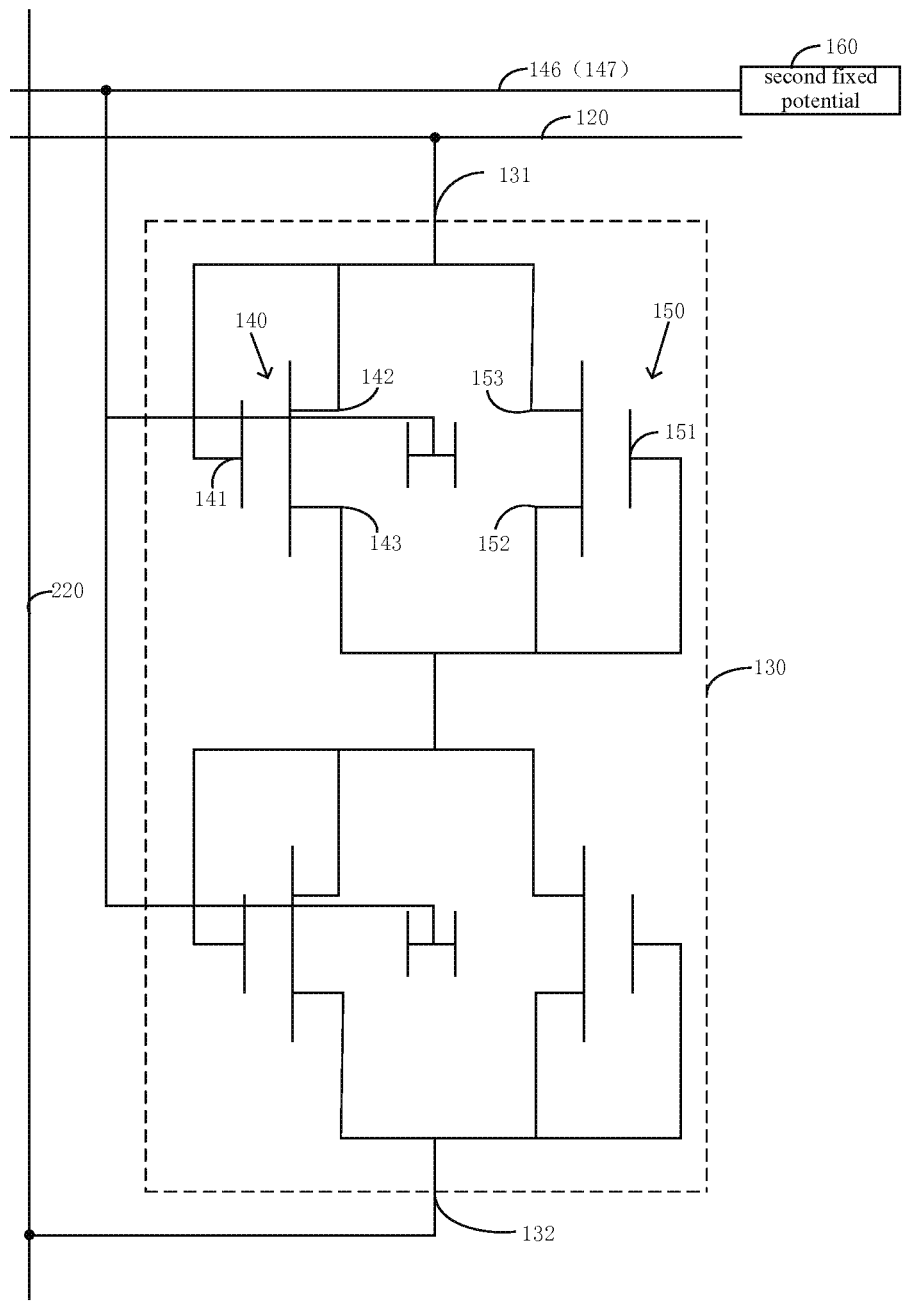
FIG. 8 is an amplified view of the ESD protection circuit connected between the scan line and the ESD leakage bus in FIG. 7, in accordance with one embodiment of the present invention.

FIG. 7 is a schematic diagram of an equivalent circuit of an X-ray flat panel detector in an embodiment of an X-ray flat panel detector with an ESD protection system, in accordance with one embodiment of the present invention. FIG. 8 is an amplified view of the ESD protection circuit connected between the scan line and the ESD leakage bus in FIG. 7, in accordance with one embodiment of the present invention. As shown in FIG. 7 and FIG. 8, the X-ray flat panel detector includes multiple (two or more) scan lines (or gate lines) 220 and multiple (two or more) data lines 210 formed on substrate 110, in which the multiple scan lines 220 and the multiple data lines 210 are arranged in an intersecting manner to form multiple pixel regions. A pixel unit 200 is provided in each of the pixel regions. Pixel units 200 in the same row are connected by a data line 210. Pixel units 200 in the same column are connected by a scan line 220. One terminal of each pixel unit 200 is connected to one of the data lines and the other end of each pixel unit 200 is connected to one of the scan lines. Pixel unit 200 includes a photosensitive unit 230 and a pixel switch 240. One terminal of photosensitive unit 230 is connected to a second conductive layer 250 which is externally biased, so as to receive a bias signal. The other terminal of photosensitive unit 230 is connected to pixel switch 240. Substrate 110 may be a common semiconductor substrate, and may also be a glass substrate. Only two pixel units 200, one data line 210 and two scan lines 220 are shown in FIG. 7. However, it should be understood by those skilled in the art that the X-ray flat panel detector may include N×N pixel units 200, which are respectively provided in the pixel regions formed by the N data lines 210 and N scan lines 220 arranged in an intersecting manner, where N is any integral number greater than 0. Second conductive layer 250 should to be formed of transparent conductive material. In an embodiment, the transparent conductive material may be ITO.

Figure 9:
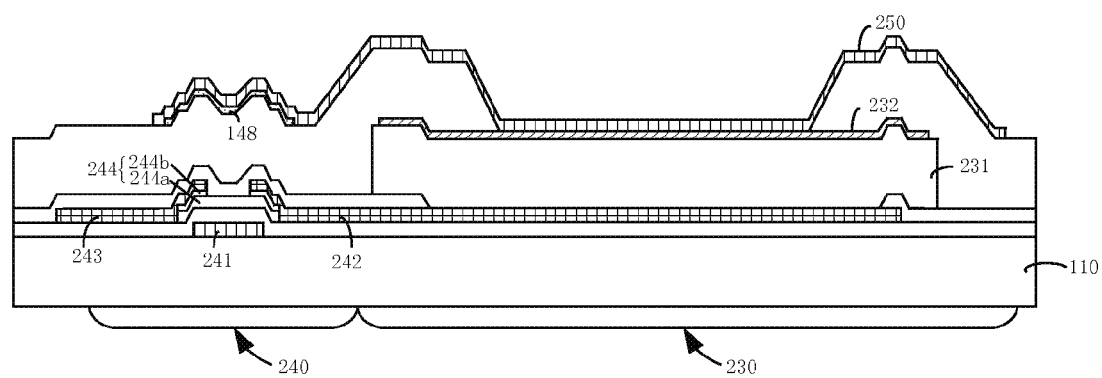
FIG. 9 is a sectional view of a pixel unit in an embodiment of an X-ray flat panel detector, in accordance with one embodiment of the present invention.

FIG. 9 is a sectional view of a pixel unit in an embodiment of an X-ray flat panel detector, in accordance with one embodiment of the present invention. In this embodiment, the photosensitive unit 230 is a photodiode, and pixel unit 240 is an amorphous silicon thin film transistor (a-Si TFT). Pixel switch 240 includes a gate 241 formed on substrate 110, an active layer 244 provided above gate 241, and a source 242 and a drain 243 provided above the active layer 244. The gate 241 may be formed of metal material, such as Ti, Al or Mo, the active layer 244 includes an a-Si layer 244a and an N+ a-Si layer 244b provided above the a-Si layer 244a, and source 242 and drain 243 may be formed of metal material, such as Al or Mo. The source 242 of pixel switch 240 extends to the region in which photosensitive unit 230 is located, which serves as a lower electrode of photosensitive unit 230. A PIN-typed photoelectric conversion layer 231 is formed on source 242 located on the region of photosensitive unit 230. PIN-typed photoelectric conversion layer 231 includes a P+ a-Si layer, an I a-Si layer and an N+ a-Si layer in this order from bottom to top. An upper electrode 232 is formed on PIN-typed photoelectric conversion layer 231, and upper electrode 232 is connected to second conductive layer 250 which is externally biased, for applying a negative fixed potential to second conductive layer 250 when the X-ray flat panel detector is driven to work, so as to enable photosensitive unit 230.

Practically, photosensitive unit 230 is not limited to the photodiode, and may also be other forms of photosensitive units. Pixel switch 240 is not limited to the amorphous silicon thin film transistor, and may also be other forms of switch elements.

As shown in FIG. 7 and FIG. 8, the X-ray flat panel detector further includes the ESD protection system mentioned in either of the above embodiments. The ESD protection system includes ESD leakage bus 120 and ESD protection circuit 130. In the case that the ESD protection system is applied to the X-ray flat panel detector, the number of ESD protection circuit 130 may be one or more. ESD protection circuit 130 has first wiring terminal 131 connected to ESD leakage bus 120 and second wiring terminal 132 connected to scan line 220. The X-ray flat panel detector normally includes two or more scan lines 220. Preferably, each scan line 220 in the X-ray flat panel detector is connected to an ESD protection circuit 130. In other words, in the X-ray flat panel detector, the number of the ESD protection circuit 130 is equal to that of the number of scan lines 220.

Figure 10:
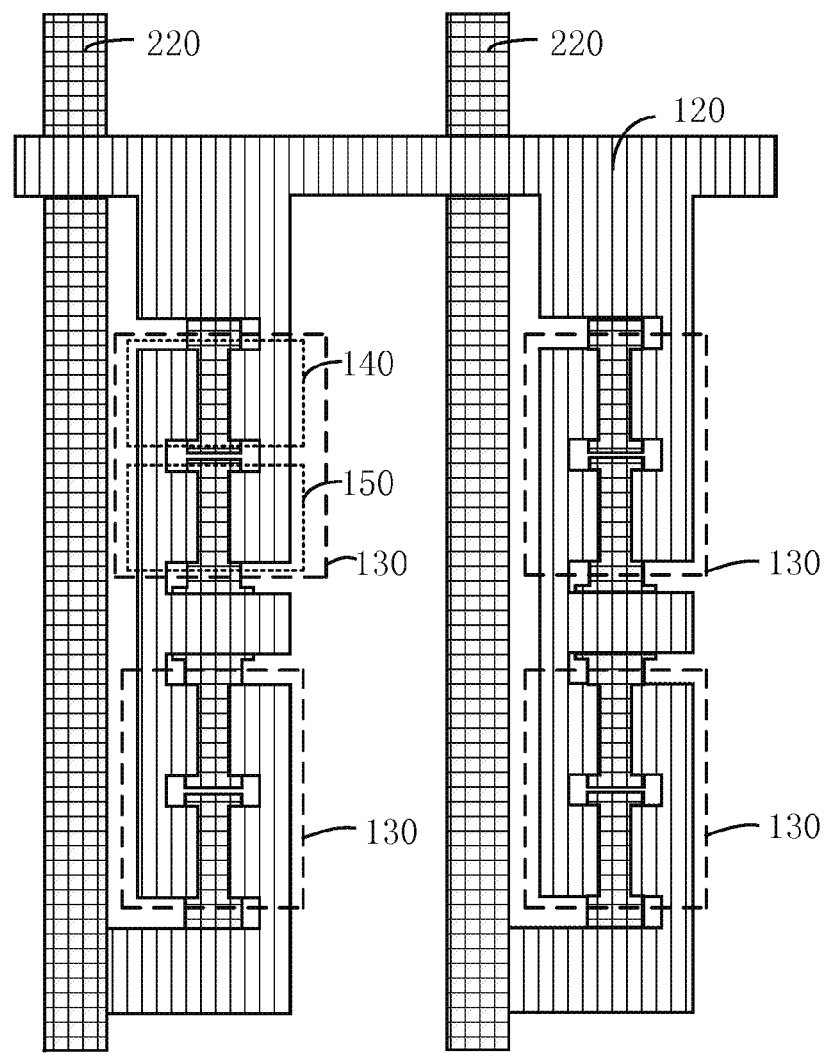
FIG. 10 is a structural diagram of an arrangement in which the first amorphous silicon thin film transistor and the second amorphous silicon thin film transistor are connected between the ESD leakage bus and the scan line, in accordance with one embodiment of the present invention.

FIG. 10 is a structural diagram of an arrangement in which the first amorphous silicon thin film transistor and the second amorphous silicon thin film transistor are connected between the ESD leakage bus and the scan line, in accordance with one embodiment of the present invention. As shown in FIG. 8 and FIG. 10, ESD protection circuit 130 includes at least a pair of amorphous silicon thin film transistors. The pair of amorphous silicon thin film transistors includes first amorphous silicon thin film transistor 140 and second amorphous silicon thin film transistor 150 connected in a back-to-back manner. Specifically, gate 141 and source 142 of first amorphous silicon thin film transistor 140 and drain 153 of second amorphous silicon thin film transistor 150 are connected to ESD leakage bus 120. Drain 143 of first amorphous silicon thin film transistor 140 and gate 151 and source 152 of second amorphous silicon thin film transistor 150 are connected to scan line 220. Source 142 and drain 143 of first amorphous silicon thin film transistor 140, source 152 and drain 153 of second amorphous silicon thin film transistor 150, and ESD leakage bus 120 may be made of the same layer of metal (depicted by the same fill pattern), so as to achieve the connection between source 142 of first amorphous silicon thin film transistor 140 and drain 153 of second amorphous silicon thin film transistor 150 and ESD leakage bus 120. Scan line 220, gate 141 of first amorphous silicon thin film transistor 140 and gate 151 of second amorphous silicon thin film transistor 150 may be made of the same layer of metal (depicted by the same fill pattern).

In this embodiment, ESD protection circuit 130 has two pairs of amorphous silicon thin film transistors connected in series. In the X-ray flat panel detector, when ESD occurs on scan line 220 and thus leads to a voltage between first wiring terminal 131 and second wiring terminal 132 of ESD protection circuit 130 which is larger than two times of the threshold voltage of the TFT, then first amorphous silicon thin film transistor 140 and second amorphous silicon thin film transistor 150 in ESD protection circuit 130 will be switched on automatically, so that the ESD will flow quickly from scan line 220 to ESD leakage bus 120. In this way, a part of the detector is prevented from being broken-down by the ESD voltage or from generating TFT threshold voltage drift or other damages.

Figure 11:
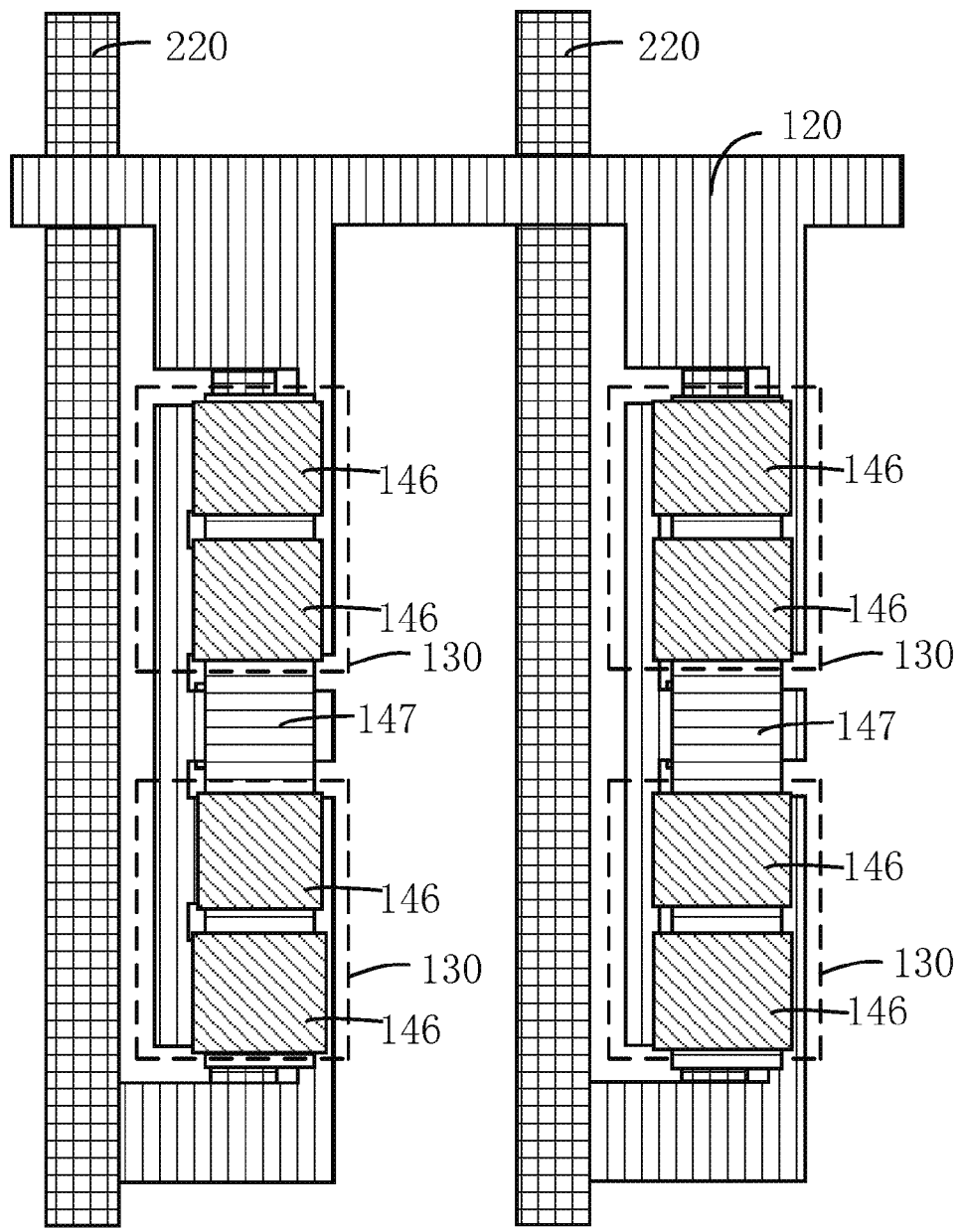
FIG. 11 is a first structural diagram of the arrangement in FIG. 10 in which a first shading layer and a first conductive layer are provided above a channel of the first amorphous silicon thin film transistor and a channel of the second amorphous silicon thin film transistor, in accordance with one embodiment of the present invention.
Figure 12:
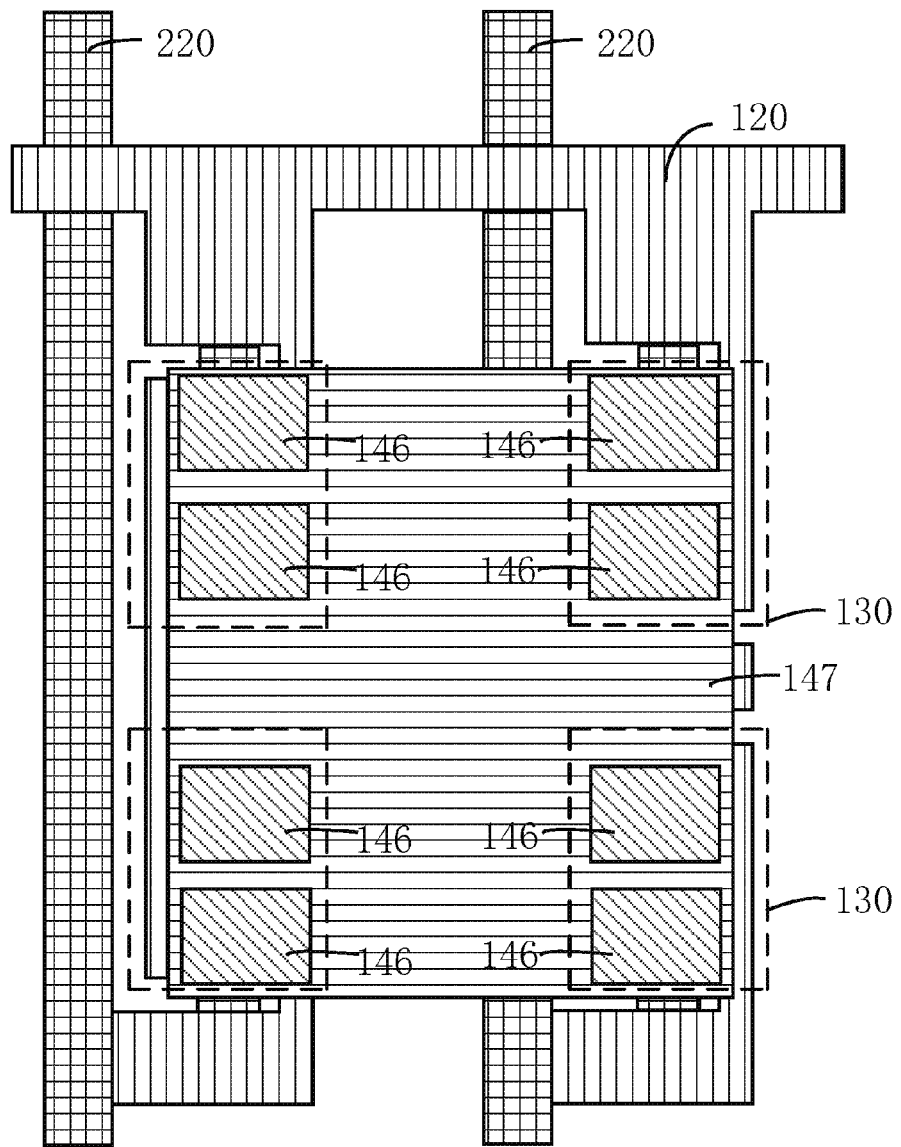
FIG. 12 is a second structural diagram of the arrangement in FIG. 10 in which a first shading layer and a first conductive layer are provided above a channel of the first amorphous silicon thin film transistor and a channel of the second amorphous silicon thin film transistor, in accordance with one embodiment of the present invention.
Figure 13:
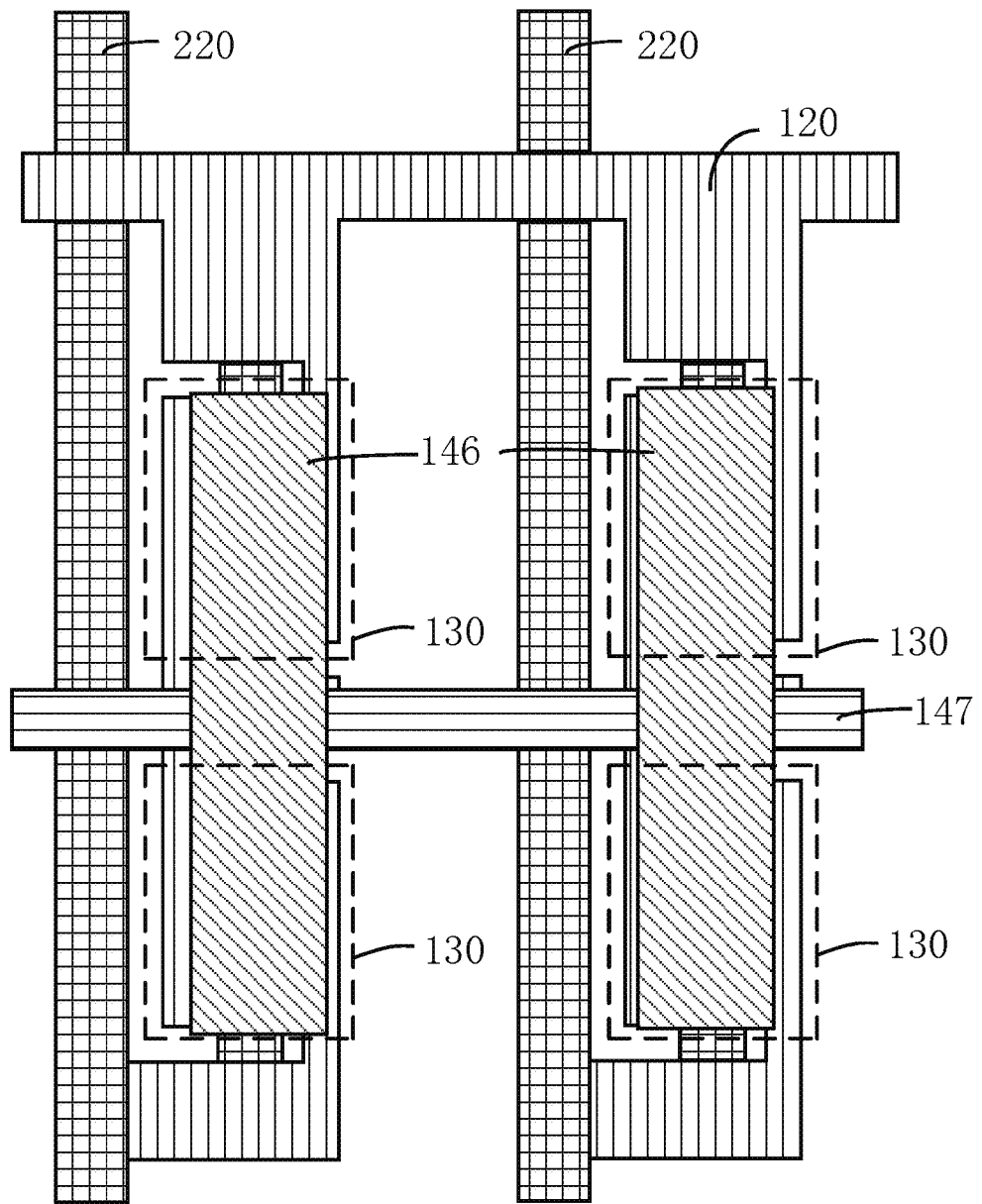
FIG. 13 is a third structural diagram of the arrangement in FIG. 10 in which a first shading layer and a first conductive layer are provided above a channel of the first amorphous silicon thin film transistor and a channel of the second amorphous silicon thin film transistor, in accordance with one embodiment of the present invention.

FIG. 11 is a first structural diagram of the arrangement in FIG. 10 in which a first shading layer and a first conductive layer are provided above the channel of the first amorphous silicon thin film transistor and the channel of the second amorphous silicon thin film transistor, in accordance with one embodiment of the present invention. FIG. 12 is a second structural diagram of the arrangement in FIG. 10 in which a first shading layer and a first conductive layer are provided above the channel of the first amorphous silicon thin film transistor and the channel of the second amorphous silicon thin film transistor, in accordance with one embodiment of the present invention. FIG. 13 is a third structural diagram of the arrangement in FIG. 10 in which a first shading layer and a first conductive layer are provided above the channel of the first amorphous silicon thin film transistor and the channel of the second amorphous silicon thin film transistor, in accordance with one embodiment of the present invention.

As shown in FIG. 10, FIG. 11, FIG. 12 and FIG. 13, in order to prevent visible light from radiating to the channels of first amorphous silicon thin film transistor 140 and second amorphous silicon thin film transistor 150 of ESD protection circuit 130 during the use of the X-ray flat panel detector, so as to generate the photocurrent in ESD protection circuit 130, first shading layer 146 may be provided in the ESD protection system, and first shading layer 146 is provided over the channel of first amorphous silicon thin film transistor 140 and the channel of second amorphous silicon thin film transistor 150. In an embodiment, in ESD protection circuit 130, first shading layer 146 provided over the channel of first amorphous silicon thin film transistor 140 is separated from first shading layer 146 provided over the channel of second amorphous silicon thin film transistor 150, as shown in FIG. 11 and FIG. 12.

In another embodiment, in ESD protection circuit 130, first shading layer 146 provided over the channel of first amorphous silicon thin film transistor 140 is connected to first shading layer 146 provided over the channel of second amorphous silicon thin film transistor 150 as a single whole connected structure, as shown in FIG. 13. In the case that the ESD protection circuit 130 includes multiple pairs, which is depicted as two pairs in the Figures for example, of amorphous silicon thin film transistors (including first amorphous silicon thin film transistor 140 and second amorphous silicon thin film transistor 150), the first shading layers 146 provided over the multiple pairs of amorphous silicon thin film transistors are connected as a whole, as shown in FIG. 13. In other embodiments, all first shading layers 146 of ESD protection circuits 130 in the ESD protection system may be connected as a whole (not shown), for simplifying the fabricating process of first shading layer 146.

After first shading layer 146 is provided over the channel of first amorphous silicon thin film transistor 140 and the channel of second amorphous silicon thin film transistor 150 in ESD protection circuit 130, negligible photocurrent will occur in ESD protection circuit 130 during the use of the X-ray flat panel detector, the voltage of the scan line of the X-ray flat panel detector will not be affected, and thus the fluctuation of the electronic image, the noise and the waste of the driving power consumption are reduced.

As shown in FIG. 7 and FIG. 8, if first shading layer 146 provided over the channel of first amorphous silicon thin film transistor 140 and the channel of second amorphous silicon thin film transistor 150 is electrically floating, some uncontrolled effects may be introduced to the ESD protection system and the X-ray flat panel detector, so that the electrical properties of the ESD protection system and the X-ray flat panel detector may be affected. Accordingly, first shading layer 146 may be connected to second fixed potential 160, to prevent the above problems from occurring.

As described above, and as shown in FIG. 5, FIG. 7 and FIG. 8, the connection of first shading layer 146 to second fixed potential 160 includes connecting first shading layer 146 to second fixed potential 160 directly, or connecting first shading layer 146 to another conductive structure, which is connected to second fixed potential 160, if the first shading layer 146 is formed of conductive material. Alternatively, the connection of first shading layer 146 to second fixed potential 160 includes connecting the first shading layer 146 to another conductive structure, which is connected to second fixed potential 160, if first shading layer 146 is formed of nonconductive material. Thus, in the case that first conductive layer 147 in contact with first shading layer 146 is provided in the ESD protection circuit 130, if first shading layer 146 may be made of conductive material, then first conductive layer 147 is connected to second fixed potential 160. Alternatively, if first shading layer 146 may be formed of nonconductive material, first conductive layer 147 is connected to second fixed potential 160. In the case that no first conductive layer 147 is provided in the ESD protection circuit 130, if first shading layer 146 is made of conductive material, then first shading layer 146 is connected to second fixed potential 160 directly.

As shown in FIG. 8, FIG. 11, FIG. 12 and FIG. 13, if first conductive layer 147 is provided in ESD protection circuit 130, all first shading layers 146 of ESD protection circuits 130 connected onto the same scan line 220 may be connected by first conductive layer 147, which are coupled to second fixed potential 160. In the circuit with this structure, first conductive layer 147 of one ESD protection circuit 130 is separated from first conductive layer 147 of another ESD protection circuit 130, as shown in FIG. 11. In an embodiment, as shown in FIG. 12 and FIG. 13, all first conductive layers 147 of the ESD protection circuits 130 may be fabricated by a conductive layer at the same time, and then the conductive layer is connected to second fixed potential 160. In other words, all first conductive layers 147 of ESD protection circuits 130 are connected as a whole single structure. In an embodiment, as shown in FIG. 13, in ESD protection circuit 130, first shading layer 146 provided over the channel of first amorphous silicon thin film transistor 140 may be connected to first shading layer 146 provided over the channel of second amorphous silicon thin film transistor 150 as a whole single structure; and first conductive layer 147 of one ESD protection circuit 130 is connected to first conductive layer 147 of another ESD protection circuit 130 as a whole single structure. In this way, the first shading layers 146 and the first conductive layers 147 of multiple ESD protection circuits in the ESD protection system may be formed of the same layer of material, and then the fabricating process of the ESD protection system is simplified.

Second fixed potential 160 may be a zero potential, a positive fixed potential or a negative fixed potential. Second fixed potential 160 may be provided in many ways, such as by an external power supply, or by a corresponding layer already existing in the X-ray flat panel detector and having a fixed potential.

As shown in FIG. 7, if pixel switch 240 in the X-ray flat panel detector is the amorphous silicon thin film transistor, the amorphous silicon thin film transistors (including first amorphous silicon thin film transistor 140 and second amorphous silicon thin film transistor 150) in ESD protection circuit 130 and pixel switch 240 of the amorphous silicon thin film transistor are formed in the same fabricating step, and thus the two types of TFTs have the same threshold voltage. In order to ensure that first amorphous silicon thin film transistor 140 and second amorphous silicon thin film transistor 150 in ESD protection circuit 130 may be switched on and release charges under a relatively lower ESD voltage, the amorphous silicon thin film transistors in ESD protection circuit 130 and pixel switch 240 of the amorphous silicon thin film transistor generally have a threshold voltage with the range from 1V to 3V. However, when the X-ray flat panel detector is driven to work normally, the voltage applied on scan line 220 normally ranges from −10V to +25V. Due to the connection of ESD protection circuit 130 to the scan line, the voltage applied on the TFT of ESD protection circuit 130 also ranges from −10V to +25V. Then, heavy leakage current may occur in ESD protection circuit 130, no matter if the voltage applied on scan line 220 is a positive voltage or a negative voltage, which will result in heavy leakage current in scan line 220, and cause a great waste of driving power consumption.

To reduce the power consumption, second fixed potential 160 to which first shading layer 146 is connected may be a negative fixed potential. In this way, when the X-ray flat panel detector is driven to work normally, an electric field may be applied to the TFT from the back of the channel of first amorphous silicon thin film transistor 140 and the channel of second amorphous silicon thin film transistor 150, and thus the leakage current in the TFT is reduced, and the waste of driving power consumption in the X-ray flat panel detector is reduced.

Figure 14:
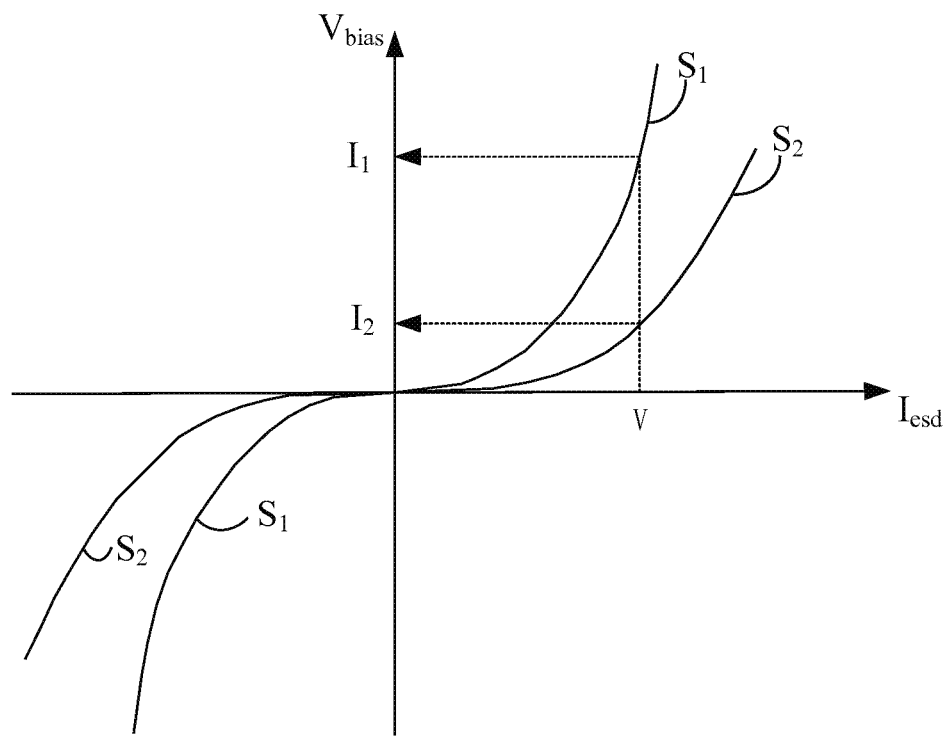
FIG. 14 is an exemplary graph of relation between an input voltage $V_{bias}$ and a leakage current $I_{esd}$ of the ESD protection circuit embodiments of the present invention, in the case that a first shading layer connected to a negative fixed potential is provided on the ESD protection circuit and a first shading layer connected to a zero potential is provided on the ESD protection circuit respectively.

FIG. 14 is an exemplary graph of relation between an input voltage $V_{bias}$ and a leakage current $I_{esd}$ of the ESD protection circuit embodiments of the present invention, in the case that a first shading layer connected to a negative fixed potential is provided on the ESD protection circuit and a first shading layer connected to a zero potential is provided on the ESD protection circuit, respectively. If a first shading layer connected to a zero potential is provided on the ESD protection circuit, the graph of the relation between the input voltage $V_{bias}$ and the leakage current $I_{esd}$ of the ESD protection circuit is depicted by $S_1$. When the input voltage $V_{bias}$ is V, the leakage current $I_{esd}$ of the ESD protection circuit is $I_1$. If a first shading layer connected to a negative fixed potential is provided on the ESD protection circuit, the graph of the relation between the input voltage $V_{bias}$ and the leakage current $I_{esd}$ of the ESD protection circuit is depicted by $S_2$. When the input voltage $V_{bias}$ is V, the leakage current $I_{esd}$ of the ESD protection circuit is $I_2$. It can be seen from comparison that $I_1 \gg I_2$. Then, if the first shading layer is connected to the negative fixed potential, the leakage current $I_{esd}$ of the ESD protection circuit may be reduced by one order of magnitude, and thus the waste of the driving power consumption is reduced.

Figure 15:
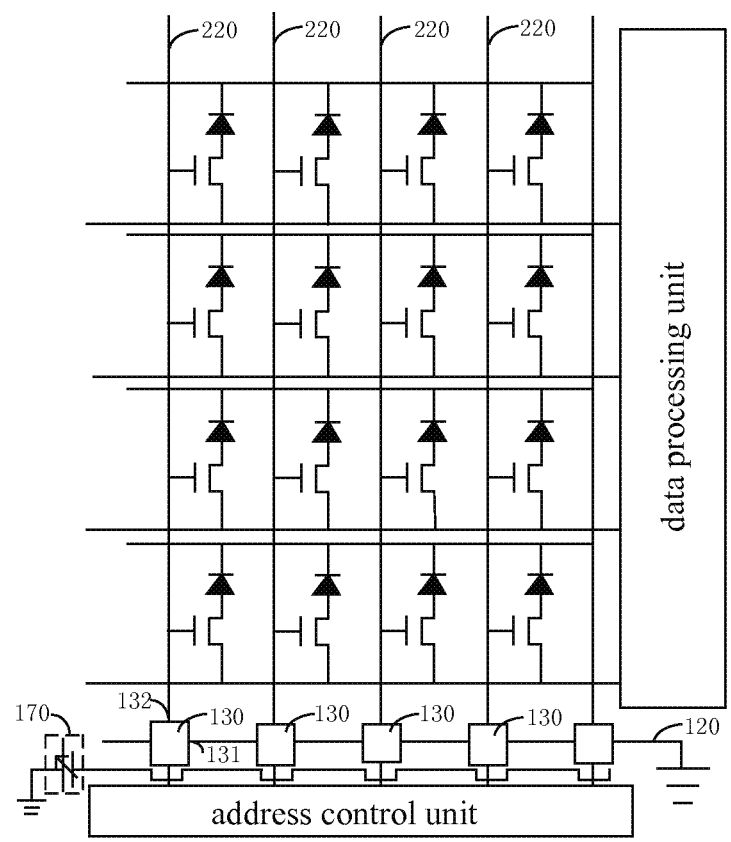
FIG. 15 is a schematic diagram of an equivalent circuit for providing a negative fixed potential for the first shading layer of the ESD protection system according to the invention, in accordance with one embodiment of the present invention.

FIG. 15 is a schematic diagram of an equivalent circuit for providing a negative fixed potential for the first shading layer of the ESD protection system, in accordance with one embodiment of the present invention. As shown in FIG. 7 and FIG. 15, first wiring terminal 131 of ESD protection circuit 130 is connected to ESD leakage bus 120, second wiring terminal 132 of ESD protection circuit 130 is connected to scan line 220, the first shading layer is connected to an external voltage source 170, and a positive terminal of external voltage source 170 is grounded. Namely, the negative fixed potential may be provided for first shading layer 146. When the driving voltage of scan line 220 of the X-ray flat panel detector varies, the amplitude of external voltage source 170 may be adjusted, so as to set the negative fixed potential to another fixed value, so that the leakage current in ESD protection circuit 130 may be minimized. The connection of first shading layer 146 to external voltage source 170 includes connecting first shading layer 146 to external voltage source 170 directly, or contacting first shading layer 146 with first conductive layer 147, which is connected to external voltage source 170, if first shading layer 146 is formed of conductive material. Alternatively, the connection of first shading layer 146 to external voltage source 170 includes contacting first shading layer 146 with first conductive layer 147, which is connected to external voltage source 170, if first shading layer 146 is formed of nonconductive material.

As described above, and as shown in FIG. 6 and FIG. 9, in the case that pixel unit 200 in the X-ray flat panel detector includes photodiode 230 and amorphous silicon thin film transistor 240, a negative fixed potential will be preferably applied to second conductive layer 250 when the X-ray flat panel detector is driven to work, so as to enable photosensitive unit 230. Thus, first shading layer 146 provided above the ESD protection circuit may be connected to second conductive layer 250, for providing the negative fixed potential. The connection of first shading layer 146 to second conductive layer 250 includes contacting first shading layer 146 with first conductive layer 147, which is connected to second conductive layer 250. If first conductive layer 147 is also formed of transparent conductive material (such as ITO), first conductive layer 147 and second conductive layer 250 may be formed in the same fabricating step, and are connected as a whole in one single structure.

Figure 16:
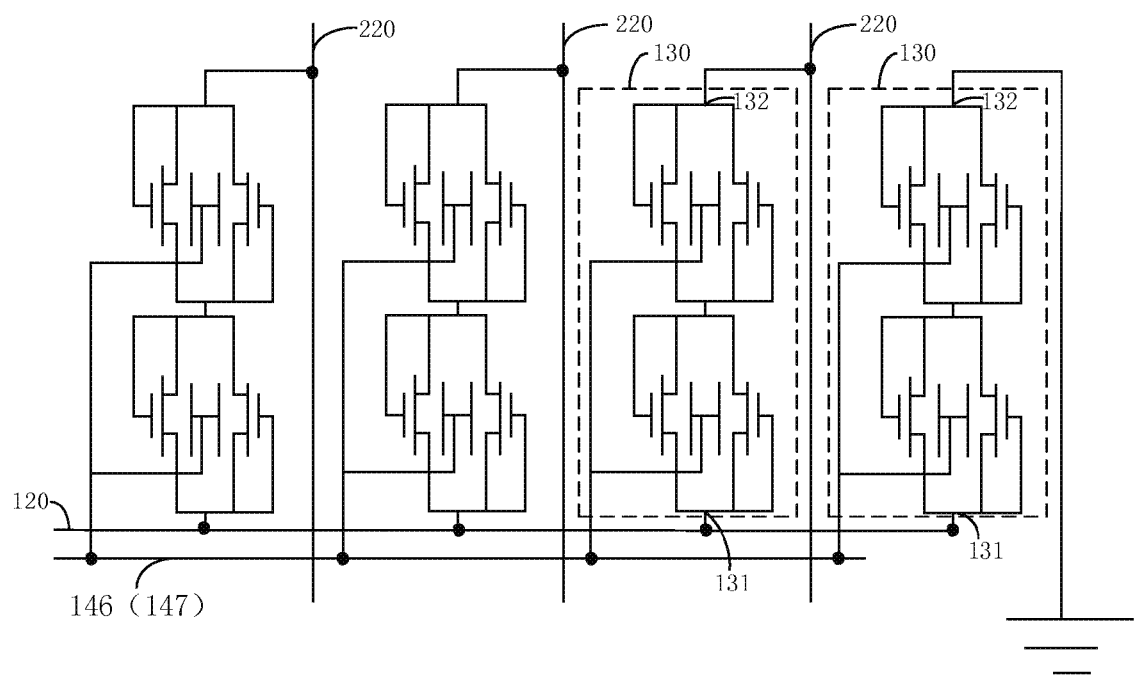
FIG. 16 is a schematic diagram of another equivalent circuit for providing a negative fixed potential for the first shading layer of the ESD protection system, in accordance with one embodiment of the present invention.

FIG. 16 is a schematic diagram of another equivalent circuit for providing a negative fixed potential for the first shading layer of the ESD protection system, in accordance with one embodiment of the present invention. As shown in FIG. 9 and FIG. 16, pixel unit 200 includes photodiode 230 and amorphous silicon thin film transistor 240. Scan line 220 is usually on the lowest level of −10V or even −20V most of the time, so as to switch off pixel switch 240 in pixel unit 200, and only one scan line 220 is on a high level at a certain time instant. The X-ray flat-panel radiator generally includes thousands of scan lines 220. Other scan lines 220 are on a low level when one scan line 220 is applied with high level. ESD protection circuit 130 connected to scan line 220 with high level is activated, and the generated current is distributed to ESD protection circuits 130 connected to the thousands of scan line 220 with low level, so that the level of the ESD leakage bus 120 is nearly equal to the low level of scan line 220. Thus, first shading layer 146 provided above ESD protection circuit 130 may be connected to ESD leakage bus 120, for providing the negative fixed potential. The connection of first shading layer 146 to ESD leakage bus 120 includes connecting first shading layer 146 to ESD leakage bus 120 directly, or to contacting first shading layer 146 with first conductive layer 147, which is connected to ESD leakage bus 120, if first shading layer 146 is formed of conductive material. Alternatively, the connection of first shading layer 146 to ESD leakage bus 120 includes contacting first shading layer 146 with first conductive layer 147, which is connected to ESD leakage bus 120, if first shading layer 146 is formed of nonconductive material. As compared with the above manner of providing the negative fixed potential by an external voltage source, the structure of the circuit to a great extent may be simplified in this manner of providing the negative fixed potential.

Referring to FIG. 16 again, based on all the embodiments of the X-ray flat panel detector described above, the ESD protection system includes at least two ESD protection circuits for increasing the ESD enduring voltage of the ESD protection system, in accordance with one embodiment of the present invention. Four ESD protection circuits are shown in FIG. 16 as an example. In this embodiment, first wiring terminal 131 of one of ESD protection circuits 130 (rightmost ESD protection circuit 130 in FIG. 16) is connected to ESD leakage bus 120 and second wiring terminal 132 thereof is grounded. In this embodiment, first wiring terminal 131 of another of ESD protection circuits 130 (any one of the first three ESD protection circuits 130 on the left in FIG. 16) is connected to ESD leakage bus 120 and second wiring terminal 132 thereof is connected to an associated different scan line 220. In other words, in the case that each scan lines 220 in the X-ray flat panel detector is connected to ESD protection circuit 130, the number of ESD protection circuit 130 is greater than that of the number of scan line 220 by one.

Referring to FIG. 9 again, when the X-ray flat panel detector is driven to work normally, in order to reduce the photocurrent in pixel switch 240 of the amorphous silicon thin film transistor, second shading layer 148 may be provided over the channel of pixel switch 240, so as to prevent visible light from radiating to the channel of pixel switch 240. Second shading layer 148 is formed of material with low light transmittance, such as metal, inorganic thin film or organic thin film (including light-tight ceramic or metal oxide). Second shading layer 148 may be formed of conductive material or non-conductive material. In order to prevent visible light from radiating to the channel of pixel switch 240 substantially, the area of second shading layer 148 should be greater than or equal to that of the channel of pixel switch 240. In the case of the electrically floating second shading layer 148, many uncontrolled effects to the X-ray flat panel detector may be introduced. Therefore, the second shading layer 148 may be in contact with second conductive layer 250 to provide the negative fixed potential for second shading layer 148. Accordingly, second shading layer 148 at least overlaps with a part of second conductive layer 250, and second shading layer 148 may be provided above or under second conductive layer 250 (the second shading layer 148 is provided under second conductive layer 250 as depicted in FIG. 9).

According to one embodiment of the present invention, the ESD protection system and the pixel unit of the X-ray flat panel detector may be fabricated on the same substrate. Further, all the parts of the ESD protection system except the shading layer are formed during the existing fabrication process of the X-ray flat panel detector, and thus nearly no new fabrication process is added. In addition, in the case that the ESD protection system is applied to the X-ray flat panel detector, the ESD protection system should be provided at a peripheral region of the X-ray flat panel detector and specifically in the region of the X-ray flat panel detector except in the pixel unit region.

With the above description of the embodiment, the invention can be better understood, reconstructed and used by those skilled in the art. Apparently, various variations and modifications may be made to the above embodiments by those skilled in the art based on the principle described herein without deviating from the substance and scope of the invention. Therefore, the invention should not be interpreted as limited to the above embodiments described herein, and the scope of protection of the invention should be defined by the appended claims.

What is claimed is:

1. An ESD protection system, comprising:
   an ESD leakage bus formed on a substrate; and
   an ESD protection circuit formed on the substrate and having a first wiring terminal and a second wiring terminal, wherein the first wiring terminal is connected to the ESD leakage bus, the ESD protection circuit including at least a pair of amorphous silicon thin film transistors, the pair of amorphous silicon thin film transistors including;
   a first amorphous silicon thin film transistor;
   a second amorphous silicon thin film transistor connected in a back-to-back manner with the first amorphous silicon thin film transistor; and
   a first shading layer over the channel of the first amorphous silicon thin film transistor and the channel of the second amorphous silicon thin film transistor.

2. The ESD protection system according to claim 1, wherein the ESD protection circuit includes a plurality of pairs of amorphous silicon thin film transistors which are connected in series, in parallel or in series-parallel.

3. The ESD protection system according to claim 1, wherein an area of the first shading layer is greater than or equal to that of the channel of the first amorphous silicon thin film transistor and that of the channel of the second amorphous silicon thin film transistor.

4. The ESD protection system according to claim 1, wherein the ESD leakage bus is grounded or connected to a first fixed potential.

5. The ESD protection system according to claim 1, wherein the first shading layer is formed of conductive material and is connected to a second fixed potential.

6. The ESD protection system according to claim 5, wherein the conductive material includes at least one of Mo, W or Al.

7. The ESD protection system according to claim 5, wherein the second fixed potential is a negative fixed potential or a zero potential.

8. The ESD protection system according to claim 5, wherein the second fixed potential is provided by an external power supply.

9. The ESD protection system according to claim 1, further comprising a first conductive layer provided above the channel of the first amorphous silicon thin film transistor and the channel of the second amorphous silicon thin film transistor and being contacted with the first shading layer, wherein the first conductive layer is provided above or under the first shading layer and at least overlaps with a part of the first shading layer, the first shading layer is formed of conductive material, and the first conductive layer is connected to a second fixed potential.

10. The ESD protection system according to claim 9, wherein the conductive material includes at least one of Mo, W or Al.

11. The ESD protection system according to claim 9, wherein the second fixed potential is a negative fixed potential or a zero potential.

12. The ESD protection system according to claim 9, wherein the second fixed potential is provided by an external power supply.

13. The ESD protection system according to claim 1, further comprising a first conductive layer provided above the channel of the first amorphous silicon thin film transistor and the channel of the second amorphous silicon thin film transistor and being contacted with the first shading layer, wherein the first conductive layer is provided above or under the first shading layer and at least overlaps with a part of the first shading layer, the first shading layer is formed of non-conductive material, and the first conductive layer is connected to a second fixed potential.

14. The ESD protection system according to claim 13, wherein the second fixed potential is a negative fixed potential or a zero potential.

15. The ESD protection system according to claim 13, wherein the second fixed potential is provided by an external power supply.

16. An X-ray flat panel detector, comprising:
   a plurality of scan lines;
   a plurality of data lines formed on a substrate, wherein the plurality of scan lines and the plurality of data lines are arranged in an intersecting manner to form a plurality of pixel regions, each of the plurality of pixel regions including:
      a pixel unit including a photosensitive unit; and
      a pixel switch; and
   an ESD protection system, including:
      an ESD leakage bus formed on a substrate; and
      an ESD protection circuit formed on the substrate and having a first wiring terminal and a second wiring terminal, wherein the first wiring terminal is connected to the ESD leakage bus, the ESD protection circuit including at least a pair of amorphous silicon thin film transistors, the pair of amorphous silicon thin film transistors including;
      a first amorphous silicon thin film transistor;
      a second amorphous silicon thin film transistor connected in a back-to-back manner with the first amorphous silicon thin film transistor; and a first shading layer over the channel of the first amorphous silicon thin film transistor and the channel of the second amorphous silicon thin film transistor, wherein the number of the ESD protection circuit in the ESD protection system is one or more, and at least one of the plurality of scan lines is connected to the second wiring terminal of one of the ESD protection circuits.

17. The X-ray flat panel detector according to claim 16, wherein the photosensitive unit is a photodiode, the pixel switch is an amorphous silicon thin film transistor, the photodiode includes:
a lower electrode;
a photoelectric conversion layer provided on the lower electrode; and
an upper electrode provided on the photoelectric conversion layer, wherein the lower electrode of the photodiode is connected to the pixel switch, the upper electrode of the photodiode is connected to a second conductive layer which is externally biased, and the pixel switch includes:
a source connected to the lower electrode of the photosensitive unit;
a drain connected to one of the data lines; and
a gate connected to one of the scan lines.

18. The X-ray flat panel detector according to claim 16, wherein a second shading layer is provided over the channel of the pixel switch.

19. The X-ray flat panel detector according to claim 18, wherein the second shading layer at least overlaps with a part of the second conductive layer and is contacted with the second conductive layer, and the second shading layer is provided above or under the second conductive layer.

20. The X-ray flat panel detector according to claim 16, wherein the number of the ESD protection circuit in the ESD protection system is two or more, the first wiring terminal of one of the ESD protection circuits is connected to the ESD leakage bus, and the second wiring terminal of the one of the ESD protection circuits is connected to one of the plurality of scan lines, and wherein the first wiring terminal of another of the ESD protection circuits is connected to the ESD leakage bus, and the second wiring terminal of the another of the ESD protection circuits is grounded.

21. An X-ray flat panel detector, comprising:
a plurality of scan lines;
a plurality of data lines formed on a substrate, wherein the plurality of scan lines and the plurality of data lines are arranged in an intersecting manner to form a plurality of pixel regions, each of plurality of the pixel regions including:
a pixel unit including a photosensitive unit; and
a pixel switch, wherein the photosensitive unit is a photodiode, the pixel switch is an amorphous silicon thin film transistor, and the photodiode includes:
a lower electrode;
a photoelectric conversion layer provided on the lower electrode; and
an upper electrode provided on the photoelectric conversion layer, wherein the lower electrode of the photodiode is connected to the pixel switch, the upper electrode of the photodiode is connected to a second conductive layer which is externally biased, and the pixel switch includes:
a source connected to the lower electrode of the photosensitive unit;
a drain connected to one of the data lines; and
a gate connected to one of the scan lines; and
an ESD protection system, including:
an ESD leakage bus formed on a substrate;
an ESD protection circuit formed on the substrate and having a first wiring terminal and a second wiring terminal, wherein the first wiring terminal is connected to the ESD leakage bus, the ESD protection circuit including at least a pair of amorphous silicon thin film transistors, the pair of amorphous silicon thin film transistors including:
a first amorphous silicon thin film transistor;
a second amorphous silicon thin film transistor connected in a back-to-back manner with the first amorphous silicon thin film transistor; and
a first shading layer over the channel of the first amorphous silicon thin film transistor and the channel of the second amorphous silicon thin film transistor; and
a first conductive layer provided above the channel of the first amorphous silicon thin film transistor and the channel of the second amorphous silicon thin film transistor and being contacted with the first shading layer, wherein the first conductive layer is provided above or under the first shading layer and at least overlaps with a part of the first shading layer, the first shading layer is formed of conductive material, and the first conductive layer is connected to a negative fixed potential, wherein the number of the ESD protection circuit is one or more, and at least one of the plurality of scan lines is connected to the second wiring terminal of one of the ESD protection circuits, wherein the first conductive layer is connected to the negative fixed potential, and the first conductive layer is further connected to the second conductive layer or the ESD leakage bus.

22. The X-ray flat panel detector according to claim 21, wherein the number of the ESD protection circuit in the ESD protection system is two or more, the first wiring terminal of one of the ESD protection circuits is connected to the ESD leakage bus, and the second wiring terminal of the one of the ESD protection circuits is connected to one of the plurality of scan lines, and wherein the first wiring terminal of another of the ESD protection circuits is connected to the ESD leakage bus, and the second wiring terminal of the another of the ESD protection circuits is grounded, and the ESD leakage bus is connected to the first conductive layer of the ESD protection circuit to provide the negative fixed potential.

23. An X-ray flat panel detector, comprising:
a plurality of scan lines;
a plurality of data lines formed on a substrate, wherein the plurality of scan lines and the plurality of data lines are arranged in an intersecting manner to form a plurality of pixel regions, each of plurality of the pixel regions including:
a pixel unit including a photosensitive unit; and
a pixel switch, wherein the photosensitive unit is a photodiode, the pixel switch is an amorphous silicon thin film transistor, the photodiode includes:
a lower electrode,
a photoelectric conversion layer provided on the lower electrode; and
an upper electrode provided on the photoelectric conversion layer, wherein the lower electrode of the photodiode is connected to the pixel switch, the upper electrode of the photodiode is connected to a second conductive layer which is externally biased, and the pixel switch includes:
a source connected to the lower electrode of the photosensitive unit;
a drain connected to one of the data lines; and
a gate connected to one of the scan lines; and an ESD protection system, including:
  an ESD leakage bus formed on a substrate;
  an ESD protection circuit formed on the substrate and having a first wiring terminal and a second wiring terminal, wherein the first wiring terminal is connected to the ESD leakage bus, the ESD protection circuit including at least a pair of amorphous silicon thin film transistors, the pair of amorphous silicon thin film transistors including;
    a first amorphous silicon thin film transistor;
    a second amorphous silicon thin film transistor connected in a back-to-back manner with the first amorphous silicon thin film transistor; and
    a first shading layer over the channel of the first amorphous silicon thin film transistor and the channel of the second amorphous silicon thin film transistor; and
  a first conductive layer provided above the channel of the first amorphous silicon thin film transistor and the channel of the second amorphous silicon thin film transistor and being contacted with the first shading layer, wherein the first conductive layer is provided above or under the first shading layer and at least overlaps with a part of the first shading layer, the first shading layer is formed of non-conductive material, and the first conductive layer is connected to a negative fixed potential,
  wherein the number of the ESD protection circuit is one or more, and at least one of the plurality of scan lines is connected to the second wiring terminal of one of the ESD protection circuits,
  wherein the first conductive layer is connected to the negative fixed potential, and the first conductive layer is further connected to the second conductive layer or the ESD leakage bus.

24. The X-ray flat panel detector according to claim 23, wherein the number of the ESD protection circuit in the ESD protection system is two or more, the first wiring terminal of one of the ESD protection circuits is connected to the ESD leakage bus, and the second wiring terminal of the one of the ESD protection circuits is connected to one of the plurality of scan lines, and wherein the first wiring terminal of another of the ESD protection circuits is connected to the ESD leakage bus, and the second wiring terminal of the another of the ESD protection circuits is grounded, and the ESD leakage bus is connected to the first conductive layer of the ESD protection circuit to provide the negative fixed potential.

25. An X-ray flat panel detector, comprising:
  a plurality of scan lines;
  a plurality of data lines formed on a substrate, wherein the plurality of scan lines and the plurality of data lines are arranged in an intersecting manner to form a plurality of pixel regions, each of plurality of the pixel regions including:
    a pixel unit including a photosensitive unit; and
    a pixel switch, wherein the photosensitive unit is a photodiode, the pixel switch is an amorphous silicon thin film transistor, the photodiode includes:
      a lower electrode;
      a photoelectric conversion layer provided on the lower electrode; and
      an upper electrode provided on the photoelectric conversion layer, wherein the lower electrode of the photodiode is connected to the pixel switch, the upper electrode of the photodiode is connected to a second conductive layer which is externally biased, and the pixel switch includes:
        a source connected to the lower electrode of the photosensitive unit,
        a drain connected to one of the data lines; and
        a gate connected to one of the scan lines; and
  an ESD protection system, including:
    an ESD leakage bus formed on a substrate;
    an ESD protection circuit formed on the substrate and having a first wiring terminal and a second wiring terminal, wherein the first wiring terminal is connected to the ESD leakage bus, the ESD protection circuit including at least a pair of amorphous silicon thin film transistors, the pair of amorphous silicon thin film transistors including;
      a first amorphous silicon thin film transistor;
      a second amorphous silicon thin film transistor connected in a back-to-back manner with the first amorphous silicon thin film transistor; and
      a first shading layer over the channel of the first amorphous silicon thin film transistor and the channel of the second amorphous silicon thin film transistor,
  wherein the first shading layer is formed of conductive material and is connected to a negative fixed potential,
  wherein the number of the ESD protection circuit is one or more, and at least one of the plurality of scan lines is connected to the second wiring terminal of one of the ESD protection circuits, and the ESD leakage bus is connected to the first shading layer of the ESD protection circuit.

26. The X-ray flat panel detector according to claim 25, wherein the number of the ESD protection circuit in the ESD protection system is two or more, the first wiring terminal of one of the ESD protection circuits is connected to the ESD leakage bus, and the second wiring terminal of the one of the ESD protection circuits is connected to one of the plurality of scan lines, and wherein the first wiring terminal of another of the ESD protection circuits is connected to the ESD leakage bus, and the second wiring terminal of the another of the ESD protection circuits is grounded.

* * * * *